(12) United States Patent
Iijima et al.

(10) Patent No.: US 11,818,450 B2
(45) Date of Patent: *Nov. 14, 2023

(54) CAMERA SYSTEM

(71) Applicant: Panasonic Intellectual Property Management Co., Ltd., Osaka (JP)

(72) Inventors: Hiroaki Iijima, Nara (JP); Masaya Hirade, Osaka (JP); Yuko Kishimoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/975,272

(22) Filed: Oct. 27, 2022

(65) Prior Publication Data

US 2023/0283872 A1    Sep. 7, 2023

Related U.S. Application Data

(63) Continuation of application No. 17/231,647, filed on Apr. 15, 2021, now Pat. No. 11,523,037, which is a
(Continued)

(30) Foreign Application Priority Data

Dec. 14, 2018    (JP) ................................ 2018-234399

(51) Int. Cl.
*H04N 5/225*    (2006.01)
*H04N 23/56*    (2023.01)
*H10K 39/32*    (2023.01)

(52) U.S. Cl.
CPC ............. *H04N 23/56* (2023.01); *H10K 39/32* (2023.02)

(58) Field of Classification Search
CPC ............................. H04N 23/56; H10K 39/32
See application file for complete search history.

(56) References Cited

U.S. PATENT DOCUMENTS

| 2009/0054641 A1 | 2/2009 | Kitamura et al. |
| 2012/0204960 A1 | 8/2012 | Kato et al. |
| (Continued) | | |

FOREIGN PATENT DOCUMENTS

| JP | 2003-234460 | 8/2003 |
| JP | 2009-054606 | 3/2009 |
| (Continued) | | |

OTHER PUBLICATIONS

International Search Report of PCT application No. PCT/JP2019/042904 dated Jan. 21, 2020.
(Continued)

*Primary Examiner* — James T Boylan
(74) *Attorney, Agent, or Firm* — McDermott Will & Emery LLP

(57) ABSTRACT

A camera system includes a light source having a peak emission wavelength at room temperature in a near-infrared region, and an imaging device including a photoelectric conversion element that converts near-infrared light into an electric charge. An external quantum efficiency of the photoelectric conversion element has a first peak at a first wavelength longer than the peak emission wavelength, and the external quantum efficiency at the first wavelength is higher than the external quantum efficiency at the peak emission wavelength.

20 Claims, 16 Drawing Sheets

Related U.S. Application Data continuation of application No. PCT/JP2019/042904, filed on Oct. 31, 2019.

(56) References Cited

U.S. PATENT DOCUMENTS

| | | | |
|---|---|---|---|
| 2014/0158977 A1* | 6/2014 | Supran | H01L 33/28 438/47 |
| 2017/0214875 A1* | 7/2017 | Miyake | H04N 25/75 |
| 2017/0272662 A1* | 9/2017 | Tamaki | H04N 5/33 |
| 2018/0159058 A1* | 6/2018 | Pereira | H10K 77/111 |
| 2018/0227510 A1* | 8/2018 | Machida | H04N 23/11 |
| 2019/0114794 A1* | 4/2019 | Wang | G06T 7/521 |
| 2019/0293539 A1* | 9/2019 | Manautou | G01N 15/0227 |
| 2020/0236315 A1* | 7/2020 | Kimura | G01B 11/2513 |
| 2020/0256991 A1* | 8/2020 | Kim | H04N 25/745 |

FOREIGN PATENT DOCUMENTS

| | | |
|---|---|---|
| JP | 2010-232410 | 10/2010 |
| JP | 2011-119694 | 6/2011 |
| JP | 2016-225456 | 12/2016 |
| JP | 2018-022980 | 2/2018 |

OTHER PUBLICATIONS

Jana Zaumseil et al., "Electron and Ambipolar Transport in Organic Field-Effect Transistors", Chemical Reviews, American Chemical Society, vol. 107, No. 4 (2007), Mar. 23, 2007, pp. 1296-1323.

Serap Gunes et al., "Conjugated Polymer-Based Organic Solar Cells", Chemical Reviews, American Chemical Society, vol. 107, No. 4 (2007), Apr. 11, 2007, pp. 1324-1338.

Mohamed Aoudia et al., "Synthesis of a Series of Octabutoxy- and Octabutoxybenzophthalocyanines and Photophysical Properties of Two Members of the Series", J. Am. Chem. Soc., vol. 119, No. 26, Jul. 1, 1997, pp. 6029-6039.

Gcineka Mbambisa et al., "Synthesis and electrochemical properties of purple manganese(III) and red titanium(IV) phthalocyanine complexes octa-substituted at non-peripheral positions with pentylthio groups", Polyhedron, vol. 26, issue 18, Sep. 14, 2007, pp. 5355-5364.

Non-Final Office Action issued in U.S. Appl. No. 17/231,647, dated Feb. 8, 2022.

Final Office Action issued in U.S. Appl. No. 17/231,647, dated Apr. 20, 2022.

Notice of Allowance issued in U.S. Appl. No. 17/231,647, dated Sep. 19, 2022.

* cited by examiner

CAMERA SYSTEM

CROSS-REFERENCE TO RELATED APPLICATIONS

This application is a Continuation of U.S. patent application Ser. No. 17/231,647 filed on Apr. 15, 2021, which is a Continuation of International Application No. PCT/JP2019/042904 filed on Oct. 31, 2019, which in turn claims the benefit of Japanese Application No. 2018-234399 filed on Dec. 14, 2018, the disclosures of which are incorporated in their entirety by reference herein.

BACKGROUND

1. Technical Field

The present disclosure relates to a camera system including a near-infrared light source, a near-infrared photoelectric conversion element, and an imaging device.

2. Description of the Related Art

Near-infrared imaging devices used in vehicle-mounted cameras and monitoring cameras often include near-infrared light sources because such imaging devices capture images even during the night in which light due to sunlight is absent. Therefore, in such a near-infrared imaging device during the night, an object reflects light applied from a near-infrared light source, and the reflected light is received by the imaging device, which enables the imaging device to capture images.

Meanwhile, organic semiconductor materials have, for example, physical properties and functions that are not exhibited by existing inorganic semiconductor materials such as silicon. Accordingly, in recent years, organic semiconductor materials have been actively studied as semiconductor materials that can realize novel semiconductor devices and electronic devices, as described in, for example, JANA ZAUMSEIL et al., "Electron and Ambipolar Transport in Organic Field-Effect Transistors", Chemical Reviews, American Chemical Society, 2007, Vol. 107, No. 4, pp. 1296-1323 (Non-Patent Literature 1) and Japanese Unexamined Patent Application Publication No. 2010-232410.

For example, it has been studied that a photoelectric conversion element is realized by forming an organic semiconductor material into a thin film and using the thin film as a photoelectric conversion material. SERAP GUNES et al., "Conjugated Polymer-Based Organic Solar Cells", Chemical Reviews, American Chemical Society, 2007, Vol. 107, No. 4, pp. 1324-1338 (Non-Patent Literature 2) discloses that a photoelectric conversion element that includes an organic material thin film can be used as an organic thin-film solar cell by extracting electric charges, which are carriers generated by light, as energy. Japanese Unexamined Patent Application Publication No. 2003-234460 discloses that the above photoelectric conversion element can alternatively be used as a photosensor such as a solid-state imaging element by extracting electric charges generated by light as electrical signals.

Known organic semiconductor materials having sensitivity in the near-infrared region are, for example, phthalocyanine derivatives and naphthalocyanine derivatives. For example, Japanese Patent No. 5216279 discloses a naphthalocyanine derivative having an absorption maximum wavelength of 805 nm to 825 nm.

SUMMARY

In one general aspect, the techniques disclosed here feature a camera system including a light source having a peak emission wavelength at room temperature in a near-infrared region, and an imaging device including a photoelectric conversion element that converts near-infrared light into an electric charge. An external quantum efficiency of the photoelectric conversion element has a first peak at a first wavelength longer than the peak emission wavelength, and the external quantum efficiency at the first wavelength is higher than the external quantum efficiency at the peak emission wavelength.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
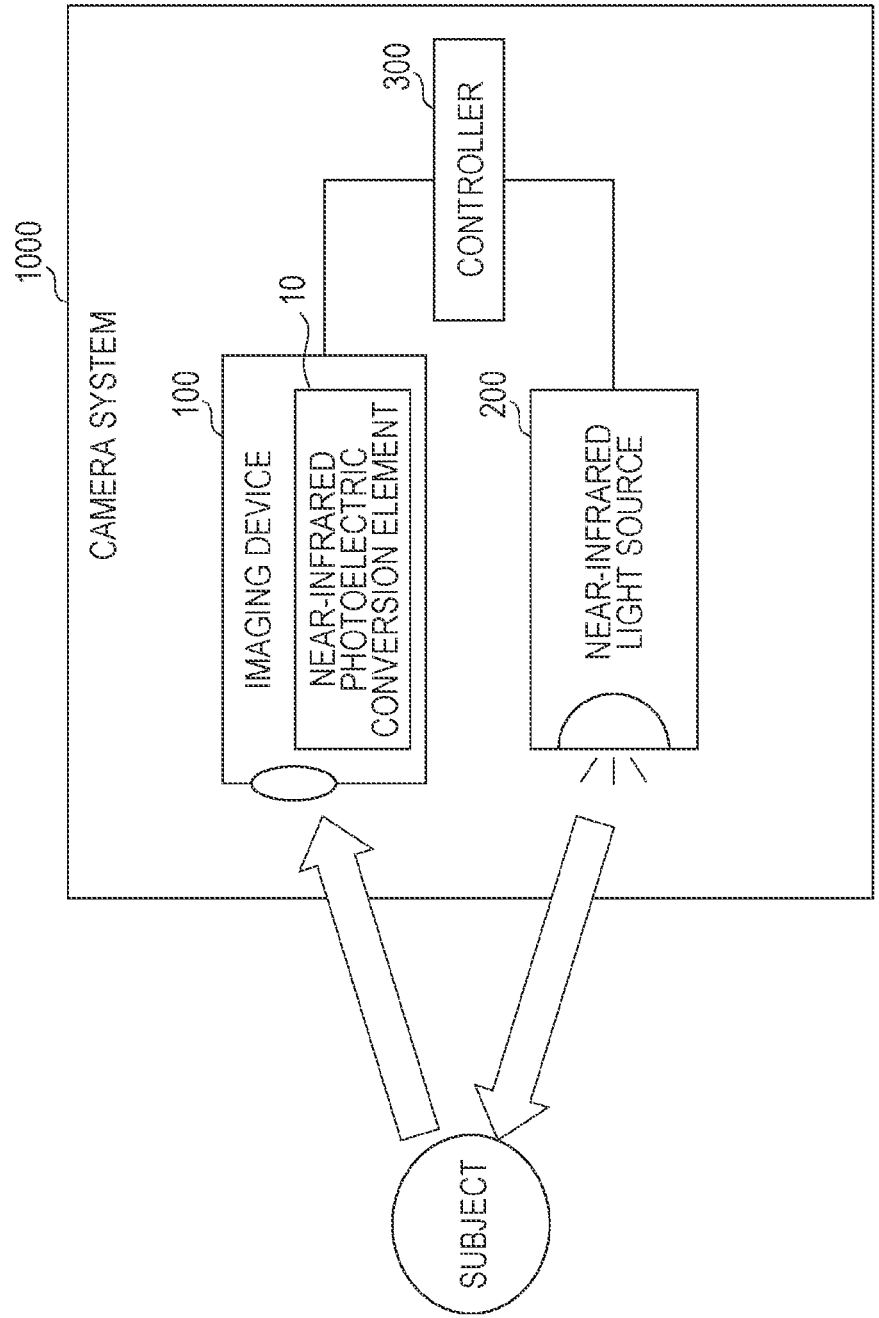
FIG. 1 is a schematic view illustrating an example of a camera system according to an embodiment.

In an existing near-infrared imaging device, a temperature change in a near-infrared light source causes a change in the radiant intensity and a peak shift of the emission wavelength of the near-infrared light source, resulting in degradation of matching to spectral sensitivity characteristics of a near-infrared photoelectric conversion element in the imaging device. Thus, there may be a problem in that good imaging cannot be performed.

Japanese Unexamined Patent Application Publication No. 2018-22980 discloses a monitoring camera including a plurality of light emitting diode (LED) light sources and a filter. Even if a peak shift of the emission wavelength of LEDs is caused by the effect of a change in the temperature of the monitoring camera and the ambient temperature or a change in the temperature of the LEDs due to heat generated from the monitoring camera, light corresponding to spectral sensitivity characteristics of an imaging device can be emitted by using the plurality of LED light sources and allowing light to pass through the filter, and good imaging can be performed.

However, the system disclosed in Japanese Unexamined Patent Application Publication No. 2018-22980 requires a plurality of LEDs and a filter that transmits only light with a particular wavelength, and consequently, the camera system has large dimensions.

Underlying Knowledge Forming Basis of the Present Disclosure

In organic semiconductor materials, a change in the molecular structure of an organic compound used enables the energy levels of the organic compound to be changed. Therefore, in the case where, for example, an organic semiconductor material is used as a photoelectric conversion material, the absorption wavelength can be controlled, and sensitivity can be provided in the near-infrared region, in which silicon (Si) has no sensitivity. That is, the use of organic semiconductor materials enables light in a wavelength region that has not hitherto been used for photoelectric conversion to be utilized. Consequently, the efficiency of solar cells can be increased, and photosensors having sensitivity in the near-infrared region can be realized. Therefore, in recent years, photoelectric conversion elements and imaging elements including an organic semiconductor material having sensitivity in the near-infrared region have been actively studied. Thus, appropriate selection of organic semiconductor materials can provide photoelectric conversion elements having particular spectral sensitivity characteristics, which are not exhibited by existing inorganic semiconductor materials such as silicon.

In recent years, imaging elements having sensitivity in the near-infrared region have been studied. Phthalocyanine derivatives and naphthalocyanine derivatives have a large $\pi$-conjugated system and a strong absorption (absorption maximum wavelength) in the near-infrared region, the strong absorption being due to $\pi$-$\pi^*$ absorption, and thus are promising candidates of the materials.

Meanwhile, when the temperature of a near-infrared light source increases, the peak emission wavelength of the near-infrared light source shifts to the long-wavelength side, and the output of the whole radiant intensity decreases. Specifically, the peak emission wavelength of the near-infrared light source is shifted by several tens of nanometers within a temperature range of about ±60° C., and a decrease in the radiant intensity occurs at a temperature higher than room temperature.

Furthermore, in a near-infrared photoelectric conversion element used in a near-infrared imaging device, as the HOMO-LUMO gap, which is the difference between the HOMO (highest occupied molecular orbital) energy level and the LUMO (lowest unoccupied molecular orbital) energy level, of a photoelectric conversion material becomes narrow, electrons present in the HOMO are thermally excited to the LUMO and are changed to a dark current, resulting in a decrease in the signal-to noise (SN) ratio of imaging in the near-infrared imaging device. On the other hand, the HOMO-LUMO gap of the photoelectric conversion material corresponds to the absorption wavelength of the photoelectric conversion material, and a narrower HOMO-LUMO gap provides absorption of near-infrared light having a longer wavelength but increases the dark current as described above.

In view of the above, the present disclosure provides a camera system in which good imaging characteristics are achieved by appropriately selecting a photoelectric conversion material corresponding to a near-infrared light source and using a material having absorption in the near-infrared region. In particular, the present disclosure provides a camera system having sufficient photoelectric conversion characteristics and exhibiting good imaging characteristics even when a peak shift of the emission wavelength and a change in the radiant intensity of the near-infrared light source are caused by a temperature change or the like.

The outline of an aspect of the present disclosure is as follows.

A camera system according to an aspect of the present disclosure includes a light source having a peak emission wavelength at room temperature in a near-infrared region, and an imaging device including a photoelectric conversion element that converts near-infrared light into an electric charge. An external quantum efficiency of the photoelectric conversion element has a first peak at a first wavelength longer than the peak emission wavelength, and the external quantum efficiency at the first wavelength is higher than the external quantum efficiency at the peak emission wavelength.

An intensity of light emitted from the light source may exhibit a maximum value at the peak emission wavelength.

The photoelectric conversion element may have spectral sensitivity at the peak emission wavelength.

The external quantum efficiency at a wavelength 200 nm longer than the first wavelength may be less than 1%.

In the present specification, the term "room temperature" refers to 25° C.

In the present specification, the term "peak emission wavelength" refers to a wavelength at which the radiant intensity of a light source is maximum.

In the present specification, the term "near-infrared region" refers to a region in which the wavelength of light is greater than or equal to 650 nm and less than or equal to 3,000 nm.

In the present specification, the expression a photoelectric conversion element "has sensitivity" at a certain wavelength means that the external quantum efficiency of the photoelectric conversion element at the wavelength is greater than or equal to 1%.

According to the present disclosure, the photoelectric conversion element included in the imaging device has spectral sensitivity at the peak emission wavelength of the near-infrared light source, and has a first peak of the external quantum efficiency at a wavelength longer than the peak emission wavelength. Accordingly, even when a peak shift of the emission wavelength to the long-wavelength side and a decrease in the radiant output are caused in the near-infrared light source by an increase in temperature, with a shift from the peak emission wavelength of the near-infrared light source to the long-wavelength side, the spectral sensitivity of the photoelectric conversion element increases, so that the imaging device easily detects near-infrared light. Therefore, as a whole of the camera system, matching between the near-infrared light source and the sensitivity of the photoelectric conversion element of the imaging device improves. This configuration can provide a camera system that exhibits good imaging characteristics even when a peak shift of the emission wavelength and a change in the radiant intensity of the near-infrared light source are caused by a temperature change.

Furthermore, when the external quantum efficiency at a wavelength 200 nm longer than the wavelength of the first spectral sensitivity peak is less than 1%, the HOMO-LUMO gap of the photoelectric conversion element is maintained in a wide state, and a dark current generated by thermal excitation of electrons is reduced. Consequently, the imaging device has a good SN ratio and exhibits better imaging characteristics.

For example, the photoelectric conversion element may have spectral sensitivity in a wavelength range of greater than or equal to −30 nm and less than or equal to +30 nm with respect to the peak emission wavelength.

With this configuration, even when a peak shift from room temperature to about −30° C. on the low-temperature side and a peak shift from room temperature to about 90° C. on the high-temperature side occur in the peak emission wavelength of the near-infrared light source, the photoelectric conversion element has spectral sensitivity, and thus the camera system has robustness with respect to a large temperature change.

For example, the peak emission wavelength may be greater than or equal to 800 nm and less than or equal to 980 nm.

With this configuration, an inexpensive light source that is generally available in the market can be used, and the cost of the entire camera system can be reduced. Furthermore, a photoelectric conversion element having spectral sensitivity at a wavelength in this range is also easily available, and the camera system can be easily manufactured.

For example, the light source may be a light emitting diode (LED) that emits monochromatic light.

With this configuration, an inexpensive light source that is generally available in the market can be used, and the cost of the entire camera system can be reduced. In addition, unlike existing camera systems, good imaging characteristics are obtained without adjusting illumination light with a filter or the like on the near-infrared light source side, and thus the equipment can be simplified.

For example, the photoelectric conversion element may include an organic material as a photoelectric conversion material.

In this configuration, the photoelectric conversion element includes an organic material in which the difference in spectral sensitivity between materials is unlikely to occur because the HOMO-LUMO gap is determined by the molecular structure. Therefore, a photoelectric conversion element having a sharp spectral sensitivity peak in the near-infrared region can be provided. Accordingly, spectral sensitivity characteristics corresponding to a shift of the peak emission wavelength of the near-infrared light source are provided, the dark current is further reduced, and thus better imaging characteristic are obtained.

For example, the organic material may be a phthalocyanine derivative or a naphthalocyanine derivative.

This configuration enables an organic material having a strong absorption in the near-infrared region to be used as a photoelectric conversion material and enables the manufacturing of a camera system capable of subjecting light in the near-infrared region to efficient photoelectric conversion.

For example, the photoelectric conversion element may include a first photoelectric conversion film that converts visible light into an electric charge and a second photoelectric conversion film that converts near-infrared light into an electric charge. The photoelectric conversion element may have a structure in which the first photoelectric conversion film and the second photoelectric conversion film are stacked.

With this configuration, imaging of visible light and near-infrared light can be achieved by using a single imaging device.

For example, the external quantum efficiency of the photoelectric conversion element may further have a second peak at a second wavelength shorter than the peak emission wavelength, and the external quantum efficiency at the second wavelength may be higher than the external quantum efficiency at the peak emission wavelength.

With this configuration, since the photoelectric conversion element having high spectral sensitivities at both a wavelength shorter than the peak emission wavelength of the near-infrared light source and a wavelength longer than the peak emission wavelength is used, imaging characteristics further improve.

For example, the external quantum efficiency of the photoelectric conversion element may be greater than or equal to 20% at the peak emission wavelength.

With this configuration, since the photoelectric conversion element having high spectral sensitivity is used, imaging characteristics further improve.

For example, the imaging device may include a substrate, a charge detection circuit disposed on or in the substrate, and a pixel that includes a photoelectric converter disposed on the substrate and including the photoelectric conversion element, and a charge storage node electrically connected to the charge detection circuit and the photoelectric converter.

This configuration enables light received by the photoelectric conversion element to be efficiently detected.

Embodiments of the present disclosure will now be specifically described with reference to the drawings.

Each of the embodiments described below indicates a general or specific example. Numerical values, shapes, materials, components, arrangement positions and connection forms of the components, steps, the order of the steps, and the like described in the embodiments below are only exemplary and are not intended to limit the present disclosure. Among the components in the following embodiments, components that are not described in an independent claim indicating the broadest concept are described as optional components. The drawings are not necessarily strict illustrations. In the drawings, substantially the same components are assigned the same reference numerals, and overlapping descriptions may be omitted or simplified.

EMBODIMENTS

Hereafter, a camera system according to an embodiment of the present disclosure will be described.

Camera System

First, the overall structure of a camera system according to this embodiment will be described. FIG. 1 is a schematic view illustrating an example of a camera system 1000 according to this embodiment.

The camera system 1000 according to this embodiment includes a near-infrared light source 200 having a peak emission wavelength at room temperature in the near-infrared region and an imaging device 100 including a near-infrared photoelectric conversion element 10. The near-infrared light source 200 in this embodiment is an example of a light source. The camera system 1000 further includes a controller 300 that controls operations of the imaging device 100 and the near-infrared light source 200.

In the camera system 1000, illumination light applied from the near-infrared light source 200 is reflected by a subject, and the reflected light is subjected to photoelectric conversion by the near-infrared photoelectric conversion element 10 of the imaging device 100 and is taken out as electrical signals to thereby perform imaging. Although the imaging device 100 and the near-infrared light source 200 are separately illustrated, the imaging device 100 and the near-infrared light source 200 may be formed as a single component, or a plurality of light sources of visible light and a plurality of imaging devices may be combined.

Any light source may be used as the near-infrared light source 200 as long as the light source has a peak emission wavelength at room temperature in the near-infrared region. For example, an LED light source and a laser diode (LD) are used as the near-infrared light source 200. The near-infrared light source 200 is, for example, a monochromatic light source of an LED, more specifically, a monochromatic near-infrared light source of an LED having a peak emission wavelength at room temperature in the near-infrared region. In this case, an inexpensive light source that is generally available in the market can be used, and the cost of the entire camera system can be reduced. As described above, the "near-infrared region" refers to a region in which the wavelength of light is greater than or equal to 650 nm and less than or equal to 3,000 nm. The near-infrared region in the peak emission wavelength may be a region of greater than or equal to 700 nm and less than or equal to 2,000 nm, and further, a region of greater than or equal to 750 nm and less than or equal to 1,400 nm.

The near-infrared light source 200 may include, for example, a plurality of LED light sources or laser diodes (LDs) including at least one near-infrared light source. The near-infrared light source 200 may be a light source whose illumination light can be adjusted with a filter or the like.

In the near-infrared light source 200, the peak emission wavelength of the near-infrared light source 200 may be greater than or equal to 800 nm and less than or equal to 980 nm, greater than or equal to 820 nm and less than or equal to 880 nm, or greater than or equal to 910 nm and less than or equal to 980 nm, at room temperature. The use of the near-infrared light source 200 having a peak emission wavelength in the above range enables an inexpensive light source that is generally available in the market to be used and enables the cost of the entire camera system 1000 to be reduced.

An LED and an LD are generally used as the near-infrared light source 200. Regarding these near-infrared light sources, it has been found that when the temperature becomes higher than room temperature, a peak shift of the emission wavelength to the long-wavelength side occurs, and when the temperature becomes lower than room temperature, a peak shift of the emission wavelength to the short-wavelength side occurs. That is, the peak emission wavelength of the near-infrared light source 200 shifts to the long-wavelength side with an increase in the temperature, and the peak emission wavelength shifts to the short-wavelength side with a decrease in the temperature. In addition, the radiant intensity of the near-infrared light source 200 decreases with an increase in the temperature, and the radiant intensity increases with a decrease in the temperature.

Figure 2:
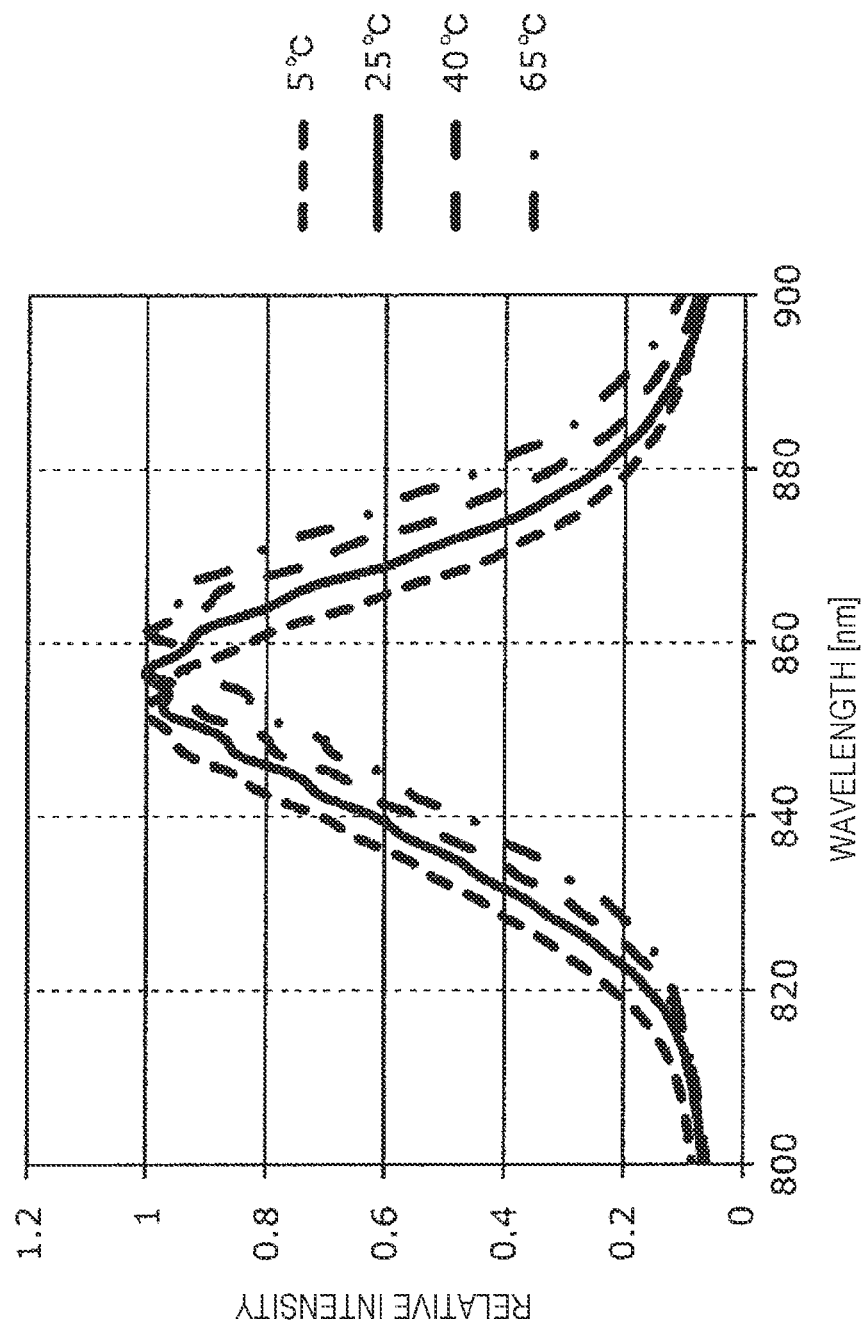
FIG. 2 is a graph illustrating spectral characteristics of a near-infrared light source according to an embodiment.

FIG. 2 is a graph illustrating spectral characteristics of a near-infrared light source and illustrates an example of the peak shift of the emission wavelength of the near-infrared light source with respect to a temperature change. In FIG. 2, the horizontal axis represents the emission wavelength of the near-infrared light source, and the vertical axis represents a relative intensity indicating the radiant intensity at each wavelength when the radiant intensity at the peak emission wavelength of the near-infrared light source is assumed to be 1. The near-infrared light source in FIG. 2 is a monochromatic light source using a near-infrared LED and has a peak emission wavelength at room temperature (25° C.) at about 850 nm. As illustrated in FIG. 2, the peak emission wavelength shifts to the long-wavelength side with the increase in the temperature, and the peak emission wavelength shifts to the short-wavelength side with the decrease in the temperature.

Figure 3:
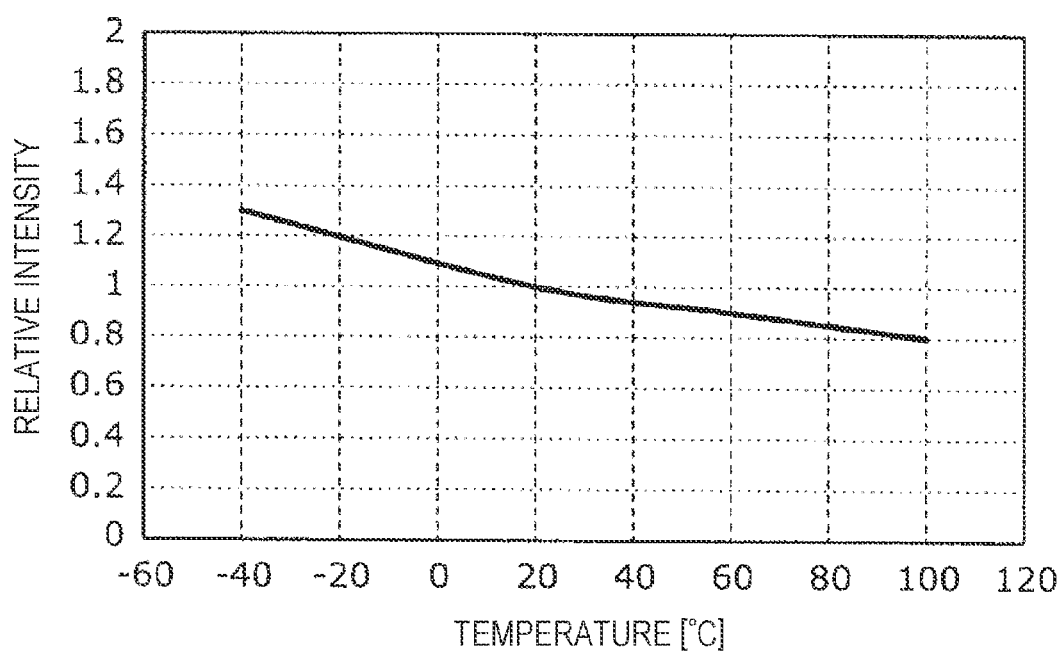
FIG. 3 is a graph illustrating temperature-radiant intensity characteristics of a near-infrared light source according to an embodiment.

FIG. 3 is a graph illustrating the radiant intensity of the near-infrared light source 200 at each temperature and illustrates temperature-radiant intensity characteristics. In FIG. 3, the horizontal axis represents the ambient temperature, and the vertical axis represents a relative intensity indicating the radiant intensity at the peak emission wavelength at each temperature when the radiant intensity at the peak emission wavelength of the near-infrared light source 200 at 20° C. is assumed to be 1. FIG. 3 illustrates the measurement results obtained by using the same near-infrared light source 200 as that used in FIG. 2. As illustrated in FIG. 3, in the range of from −40° C. to 100° C., the range including room temperature (25° C.), the radiant intensity decreases with the increase in the temperature, and the radiant intensity increases with the decrease in the temperature.

In FIGS. 2 and 3, a near-infrared LED having a peak emission wavelength at about 850 nm is used. However, the characteristics described above are similarly observed when typical near-infrared light sources are used. For example, similar characteristics are observed in the case of using a near-infrared LED having a peak emission wavelength at about 940 nm and in the case of using a near-infrared light source including an LD.

The imaging device 100 includes the near-infrared photoelectric conversion element 10. The near-infrared photoelectric conversion element 10 has spectral sensitivity at the peak emission wavelength at room temperature of the near-infrared light source 200. Furthermore, the near-infrared photoelectric conversion element 10 has, at a longer wavelength than the peak emission wavelength, a first spectral sensitivity peak having an external quantum efficiency higher than the external quantum efficiency at the peak emission wavelength, and has an external quantum efficiency of less than 1% at a wavelength 200 nm longer than the first spectral sensitivity peak. With this configuration, even when a peak shift of the emission wavelength to the long-wavelength side and a decrease in the radiant output are caused in the near-infrared light source 200 by an increase in temperature, the spectral sensitivity of the near-infrared photoelectric conversion element 10 increases with a shift from the peak emission wavelength of the near-infrared light source 200 to the long-wavelength side. Therefore, in terms of the entire camera system 1000, matching between the near-infrared light source 200 and the sensitivity of the near-infrared photoelectric conversion element 10 of the imaging device 100 improves. Accordingly, even when a peak shift of the emission wavelength and a change in the radiant intensity are caused in the near-infrared light source 200 by a temperature change, the camera system 1000 exhibits good imaging characteristics. Furthermore, in the near-infrared photoelectric conversion element 10, since the external quantum efficiency at a wavelength 200 nm longer than the first spectral sensitivity peak is less than 1%, the near-infrared photoelectric conversion element 10 has a low external quantum efficiency in a near-infrared region at a wavelength greater than or equal to 200 nm longer than the first spectral sensitivity peak. Accordingly, the HOMO-LUMO gap of the near-infrared photoelectric conversion element is maintained in a wide state, and a dark current generated by thermal excitation of electrons is reduced. Consequently, the imaging device has a good SN ratio and exhibits better imaging characteristics.

In the range from the peak emission wavelength at room temperature of the near-infrared light source 200 to the wavelength of the first spectral sensitivity peak, the external quantum efficiency in the near-infrared photoelectric conversion element 10 is preferably greater than or equal to the external quantum efficiency at the peak emission wavelength. The external quantum efficiency in the near-infrared photoelectric conversion element 10 may monotonically increase as the wavelength shifts from the peak emission wavelength at room temperature of the near-infrared light source 200 to the wavelength of the first spectral sensitivity peak. Furthermore, the wavelength of the first spectral sensitivity peak may be greater than or equal to 20 nm longer than the peak emission wavelength at room temperature of the near-infrared light source 200.

The near-infrared photoelectric conversion element 10 may further has, at a wavelength shorter than the peak emission wavelength of the near-infrared light source 200, a second spectral sensitivity peak having an external quantum efficiency higher than the external quantum efficiency at the peak emission wavelength. With this configuration, since the near-infrared photoelectric conversion element 10 having high spectral sensitivities at both a wavelength shorter than the peak emission wavelength of the near-infrared light source 200 and a wavelength longer than the peak emission wavelength is used, imaging characteristics further improve.

In the range from the peak emission wavelength of the near-infrared light source 200 to the wavelength of the second spectral sensitivity peak, the external quantum efficiency in the near-infrared photoelectric conversion element 10 is preferably greater than or equal to the external quantum efficiency at the peak emission wavelength. The external quantum efficiency in the near-infrared photoelectric conversion element 10 may monotonically increase as the wavelength shifts from the peak emission wavelength of the near-infrared light source 200 to the wavelength of the second spectral sensitivity peak.

The near-infrared photoelectric conversion element 10 may have an external quantum efficiency of greater than or equal to 20% at the peak emission wavelength of the near-infrared light source 200. With this configuration, since the near-infrared photoelectric conversion element 10 having high spectral sensitivity is used, imaging characteristics further improve.

The near-infrared photoelectric conversion element 10 may have spectral sensitivity in a wavelength range of greater than or equal to −30 nm and less than or equal to +30 nm with respect to the peak emission wavelength of the near-infrared light source 200. With this configuration, the camera system 1000 has robustness with respect to a large temperature change.

The near-infrared photoelectric conversion element 10 may include an organic material as a photoelectric conversion material.

Details of the near-infrared photoelectric conversion element 10 and the imaging device 100 will be described below.

The controller 300 controls operations of, for example, photographing by the imaging device 100 and light emission from the near-infrared light source 200. The controller 300 includes, for example, a CPU (central processing unit), a RAM (random access memory), and a ROM (read only memory).

Near-Infrared Photoelectric Conversion Element

Figure 4A:
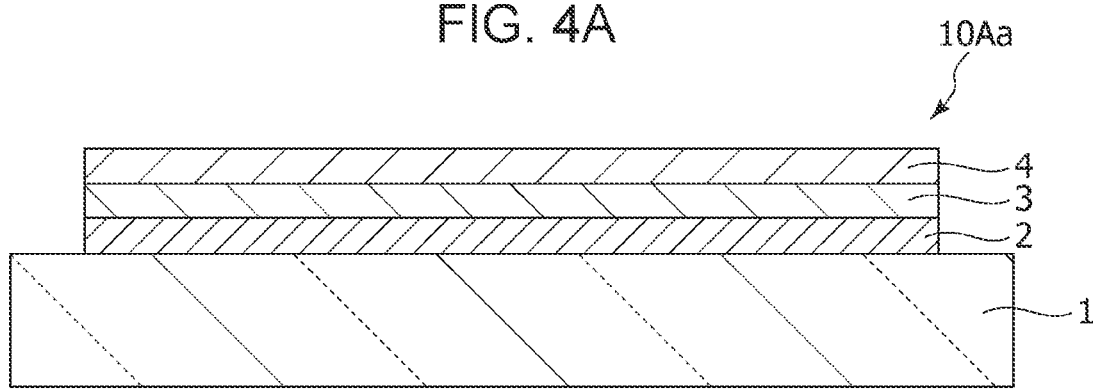
FIG. 4A is a schematic sectional view illustrating an example of a near-infrared photoelectric conversion element according to an embodiment.

Hereafter, near-infrared photoelectric conversion elements according to this embodiment will be described with reference to FIGS. 4A, 4B, and 5. FIG. 4A is a schematic sectional view of a near-infrared photoelectric conversion element 10Aa that is an example of the near-infrared photoelectric conversion element 10 in FIG. 1.

The near-infrared photoelectric conversion element 10Aa according to this embodiment includes an upper electrode 4 and a lower electrode 2, i.e., a pair of electrodes, and a near-infrared photoelectric conversion film 3 disposed between the pair of electrodes.

The near-infrared photoelectric conversion element 10Aa according to this embodiment is supported by, for example, a support substrate 1.

Light including near-infrared light is incident from the upper side or the lower side of the drawing onto the near-infrared photoelectric conversion element 10Aa. In the case where light including near-infrared light is incident from the lower side onto the near-infrared photoelectric conversion element 10Aa through the support substrate 1, the support substrate 1 is transparent to near-infrared light. The support substrate 1 may be a substrate used in general photoelectric conversion elements and may be, for example, a glass substrate, a quartz substrate, a semiconductor substrate, or a plastic substrate. The expression "transparent to near-infrared light" means "substantially transparent to near-infrared light" and means that, for example, the transmittance of light in the near-infrared region is greater than or equal to 60%. The transmittance of light in the near-infrared region may be greater than or equal to 80% and may be greater than or equal to 90%. In the case where light including near-infrared light is incident from the upper side onto the near-infrared photoelectric conversion element 10Aa, the support substrate 1 may be a substrate that absorbs near-infrared light and may be, for example, a Si substrate.

Components of the near-infrared photoelectric conversion element 10Aa according to this embodiment will be described below.

The near-infrared photoelectric conversion film 3 can be formed by using a photoelectric conversion material having sensitivity to near-infrared light. The near-infrared photoelectric conversion film 3 may include an organic material as the photoelectric conversion material. In organic materials, the HOMO-LUMO gaps are determined by the molecular structures of the organic materials. Therefore, appropriate selection of an organic material having an absorption in the near-infrared region facilitates the formation of a near-infrared photoelectric conversion film 3 having a sharp spectral sensitivity peak in the near-infrared region.

The organic material included in the near-infrared photoelectric conversion film 3 is, for example, a phthalocyanine derivative or a naphthalocyanine derivative. The near-infrared photoelectric conversion film 3 is made by using, for example, a composition containing a naphthalocyanine derivative represented by general formula (1) below or a phthalocyanine derivative represented by general formula (2) below.

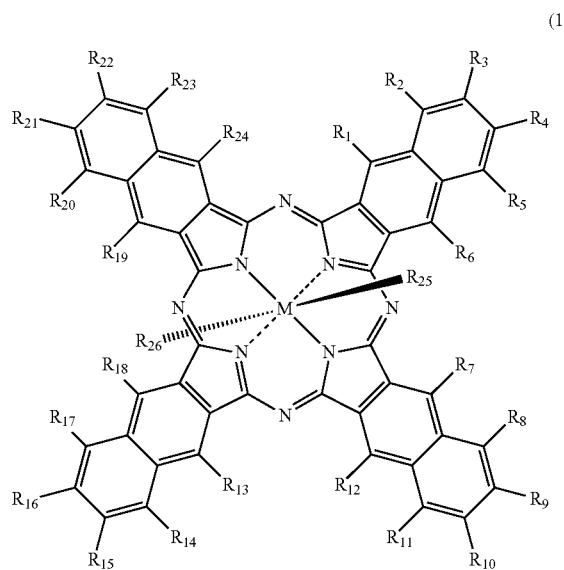

(1)

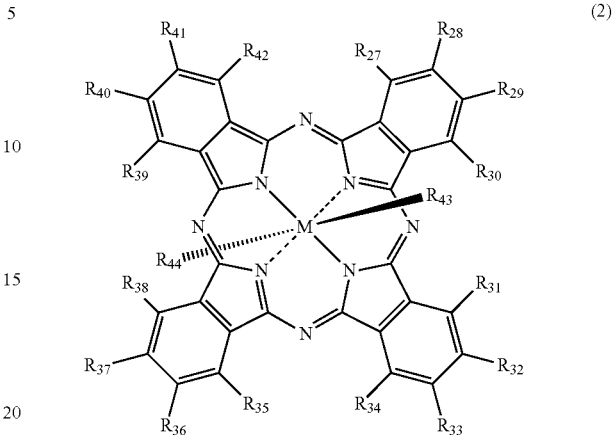

(2)

In general formula (1), $R_1$ to $R_{24}$ are substituents; M is a tetravalent metal such as Si, Ge, or Sn, a divalent metal such as Zn, Cu, Ni, Co, or Fe, a trivalent metal such as Al or Ga, or the like; when M is a divalent metal, neither $R_{25}$ nor $R_{26}$ is present, when M is a trivalent metal, either $R_{25}$ or $R_{26}$ is a substituent, and when M is a tetravalent metal, both $R_{25}$ and $R_{26}$ are substituents. The substituents each independently represent, for example, a hydrogen atom, a halogen atom, an unsubstituted or substituted alkyl group, an unsubstituted or substituted aryl group, an unsubstituted or substituted alkoxy group, an unsubstituted or substituted alkylthio group, an unsubstituted or substituted aryloxy group, an unsubstituted or substituted arylthio group, an unsubstituted or substituted amino group, an unsubstituted or substituted silanol group, an unsubstituted or substituted phosphino group, an oxy group substituted with an unsubstituted or substituted heterocyclic group, or a thio group substituted with an unsubstituted or substituted heterocyclic group.

In general formula (2), $R_{27}$ to $R_{42}$ are substituents; M is a tetravalent metal such as Si, Ge, or Sn, a divalent metal such as Zn, Cu, Ni, Co, or Fe, a trivalent metal such as Al or Ga, or the like; when M is a divalent metal, neither $R_{43}$ nor $R_{44}$ is present, when M is a trivalent metal, either $R_{43}$ or $R_{44}$ is a substituent, and when M is a tetravalent metal, both $R_{43}$ and $R_{44}$ are substituents. The substituents each independently represent, for example, a hydrogen atom, a halogen atom, an unsubstituted or substituted alkyl group, an unsubstituted or substituted aryl group, an unsubstituted or substituted alkoxy group, an unsubstituted or substituted alkylthio group, an unsubstituted or substituted aryloxy group, an unsubstituted or substituted arylthio group, an unsubstituted or substituted amino group, an unsubstituted or substituted silanol group, an unsubstituted or substituted phosphino group, an oxy group substituted with an unsubstituted or substituted heterocyclic group, or a thio group substituted with an unsubstituted or substituted heterocyclic group.

In particular, the near-infrared photoelectric conversion film 3 may be made by using a composition containing a naphthalocyanine derivative represented by general formula (3) below or a phthalocyanine derivative represented by general formula (4) below.

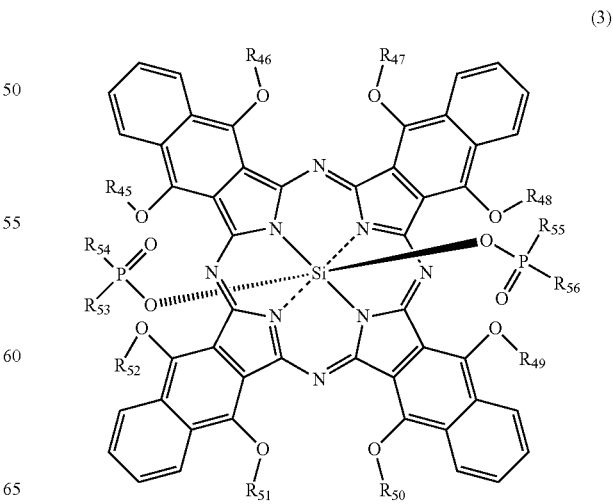

(3)

In general formula (3), $R_{45}$ to $R_{52}$ are each independently an alkyl group, and $R_{53}$ to $R_{56}$ are each independently an aryl group.

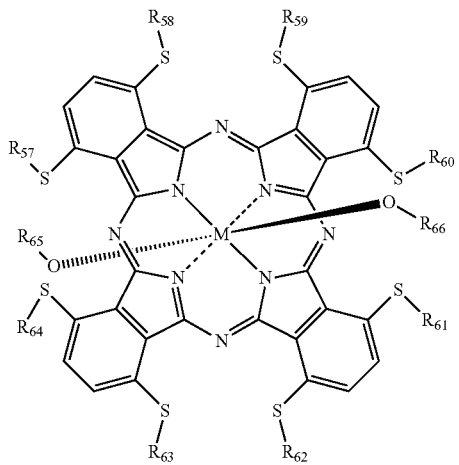

(4)

In general formula (4), $R_{57}$ to $R_{64}$ are each an alkyl group or an aryl group, M is a tetravalent metal, and $R_{65}$ and $R_{66}$ are each any one of substituents represented by general formulae (5) to (8) below. In general formulae (5) to (8) below, $R_{67}$ to $R_{69}$ are each independently an alkyl group, and $R_{70}$ to $R_{74}$ are each independently an alkyl group or an aryl group.

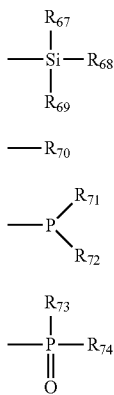

(5)
(6)
(7)
(8)

From the viewpoint of reducing the dark current, in at least one of $R_{53}$, $R_{54}$, $R_{55}$, or $R_{56}$ in general formula (3) or at least one of $R_{65}$ or $R_{66}$ in general formula (4), at least one hydrogen atom may be substituted with a fluorine atom or a fluorine-containing group.

The near-infrared photoelectric conversion film 3 may include a naphthalocyanine derivative or phthalocyanine derivative having a composition other than those represented by the general formulae above or may include an organic photoelectric conversion material other than a naphthalocyanine derivative or a phthalocyanine derivative. Examples of the organic photoelectric conversion material other than a naphthalocyanine derivative or a phthalocyanine derivative include chlorophyll derivatives, squarylium derivatives, merocyanine derivatives, perylenetetracarboxylic acid derivatives, triarylamine compounds, benzidine compounds, pyrazoline compounds, styrylamine compounds, hydrazone compounds, triphenylmethane compounds, carbazole compounds, polysilane compounds, thiophene compounds, cyanine compounds, oxonol compounds, polyamine compounds, indole compounds, pyrrole compounds, pyrazole compounds, polyarylene compounds, fused aromatic carbocyclic compounds (such as naphthalene derivatives, anthracene derivatives, phenanthrene derivatives, tetracene derivatives, pyrene derivatives, perylene derivatives, and fluoranthene derivatives), and metal complexes having nitrogen-containing heterocyclic compounds as ligands.

In the near-infrared photoelectric conversion film 3, carbon nanotubes or quantum dots may be used as the photoelectric conversion material. The photoelectric conversion material may be an inorganic semiconductor such as a Si semiconductor or a compound semiconductor.

Examples of the method for making the near-infrared photoelectric conversion film 3 include a coating method by, for example, spin coating and a vacuum vapor deposition method in which a material of a film is vaporized by heating under vacuum and is deposited on a substrate. In the case of spin coating, a film can be formed in, for example, air or a $N_2$ atmosphere. The film may be formed at a number of revolutions of greater than or equal to 300 rpm and less than or equal to 3,000 rpm. After spin coating, a baking process may be performed to evaporate a solvent and stabilize the film. The baking temperature may be any temperature but may be, for example, higher than or equal to 60° C. and lower than or equal to 250° C.

In consideration of preventing the contamination of impurities and forming a multilayer structure for higher functionality with a higher degree of freedom, a vapor deposition method may be employed as the method for making the near-infrared photoelectric conversion film 3. A vapor deposition apparatus used may be a commercially available apparatus. The temperature of an evaporation source during vapor deposition is, for example, higher than or equal to 100° C. and lower than or equal to 500° C. and may be higher than or equal to 150° C. and lower than or equal to 400° C. The degree of vacuum during vapor deposition is, for example, greater than or equal to $1 \times 10^{-6}$ Pa and less than or equal to 1 Pa and may be greater than or equal to $1 \times 10^{-6}$ Pa and less than or equal to $1 \times 10^{-4}$ Pa. The near-infrared photoelectric conversion film 3 may be made by using a method in which the vapor deposition rate is increased by adding fine metal particles or the like to the evaporation source.

The blending ratio of materials of the near-infrared photoelectric conversion film 3 is expressed in terms of weight ratio in the case of the coating method or in terms of volume ratio in the case of the vapor deposition method. More specifically, in the coating method, the blending ratio is determined on the basis of the weight of each material used in preparation of a solution. In the vapor deposition method, the blending ratio of the materials is determined while the thickness of a vapor-deposited film of each material is monitored with a film-thickness meter during vapor deposition.

At least one of the upper electrode 4 or the lower electrode 2 is a transparent electrode formed of a conductive material that is transparent to near-infrared light. The conductive material may also be transparent to the visible light region. A bias voltage is applied to the lower electrode 2 and the upper electrode 4 through a wiring line (not illustrated). For example, the polarity of the bias voltage is set such that, among electric charges generated in the near-infrared photoelectric conversion film 3, electrons move to the upper electrode 4 and holes move to the lower electrode 2. Alternatively, the polarity of the bias voltage may be set such that, among electric charges generated in the near-infrared photoelectric conversion film 3, holes move to the upper electrode 4 and electrons move to the lower electrode 2.

The bias voltage is applied such that the value obtained by dividing the applied voltage by the distance between the lower electrode 2 and the upper electrode 4, that is, the intensity of the electric field generated in the near-infrared photoelectric conversion element 10Aa is, for example, within a range of greater than or equal to $1.0 \times 10^3$ V/cm and less than or equal to $1.0 \times 10^7$ V/cm or may be within a range of greater than or equal to $1.0 \times 10^4$ V/cm and less than or equal to $1.0 \times 10^7$ V/cm. Adjustment of the magnitude of the bias voltage as described above causes electric charges to efficiently move to the upper electrode 4 and enables signals corresponding to the electric charges to be extracted to the outside.

The material of the lower electrode 2 and the upper electrode 4 may be a transparent conducting oxide (TCO) having a high transmittance for light in the near-infrared region and a low resistance. A metal thin film made of, for example, gold (Au) can also be used as a transparent electrode. However, in order to obtain a transmittance of greater than or equal to 90% for light in the near-infrared region, the resistance of the transparent electrode may extremely increase compared with a case where a transparent electrode is made so as to have a transmittance of greater than or equal to 60% and less than or equal to 80%. Therefore, the TCO can provide a transparent electrode that is highly transparent to near-infrared light and that has a low resistance compared with metal materials such as Au. Examples of the TCO that can be used include, but are not particularly limited to, indium tin oxide (ITO), indium zinc oxide (IZO), aluminum-doped zinc oxide (AZO), fluorine-doped tin oxide (FTO), $SnO_2$, $TiO_2$, and $ZnO_2$. The lower electrode 2 and the upper electrode 4 may be formed by appropriately using TCOs and metal materials such as Au alone or in combination of two or more thereof depending on a desired transmittance.

The material of the lower electrode 2 and the upper electrode 4 is not limited to the above-described conductive material transparent to near-infrared light and may be another material.

Various methods are used to make the lower electrode 2 and the upper electrode 4 depending on the material used. In the case of using, for example, ITO, examples of the method that can be used include an electron beam method, a sputtering method, a resistance heating vapor deposition method, a chemical reaction method such as a sol-gel method, and a method of applying a dispersion of indium tin oxide. In this case, after an ITO film is formed, the ITO film may be further subjected to, for example, a UV-ozone treatment or a plasma treatment to make the lower electrode 2 and the upper electrode 4.

According to the near-infrared photoelectric conversion element 10Aa, photoelectric conversion is caused in the near-infrared photoelectric conversion film 3 by near-infrared light that enters the near-infrared photoelectric conversion film 3 through the upper electrode 4. Consequently, holes and electrons of hole-electron pairs generated by the photoelectric conversion are collected by the lower electrode 2 and the upper electrode 4, respectively. Thus, near-infrared light that has entered the near-infrared photoelectric conversion element 10Aa can be detected by measuring, for example, the potential of the lower electrode 2.

The near-infrared photoelectric conversion element 10Aa may further include an electron-blocking layer 5 and hole-blocking layer 6 described below. The injection of electrons into the near-infrared photoelectric conversion film 3 from the lower electrode 2 and the injection of holes into the near-infrared photoelectric conversion film 3 from the upper electrode 4 can be suppressed by sandwiching the near-infrared photoelectric conversion film 3 between the electron-blocking layer 5 and the hole-blocking layer 6. This enables the dark current to be reduced. Details of the electron-blocking layer 5 and the hole-blocking layer 6 will be described below.

Figure 4B:
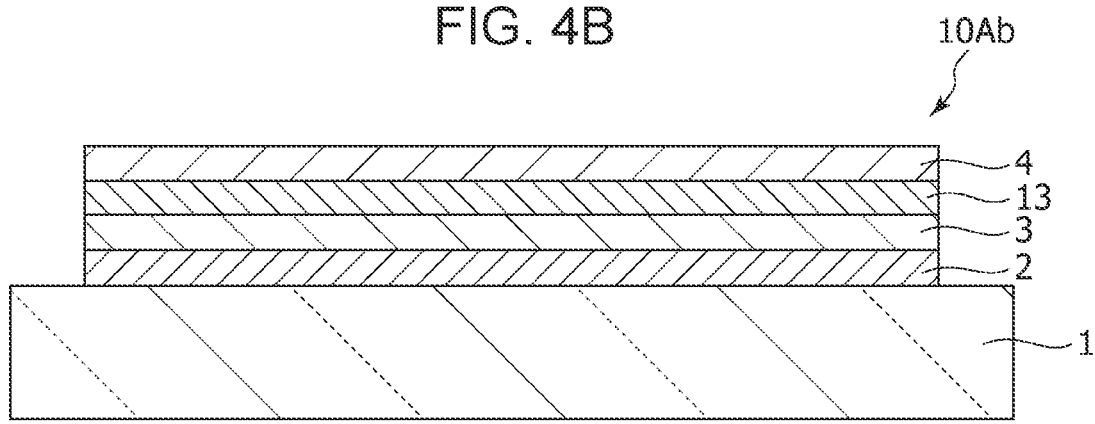
FIG. 4B is a schematic sectional view illustrating an example of a near-infrared photoelectric conversion element including a visible-light photoelectric conversion film according to an embodiment.

FIG. 4B is a schematic sectional view of a near-infrared photoelectric conversion element 10Ab including a visible-light photoelectric conversion film 13. In the near-infrared photoelectric conversion element 10Ab illustrated in FIG. 4B, the same components as those of the near-infrared photoelectric conversion element 10Aa illustrated in FIG. 4A are assigned the same reference numerals.

The near-infrared photoelectric conversion element 10Ab according to this embodiment has a structure in which a visible-light photoelectric conversion film 13 and a near-infrared photoelectric conversion film 3 are stacked. As illustrated in FIG. 4B, the near-infrared photoelectric conversion element 10Ab includes an upper electrode 4 and a lower electrode 2, i.e., a pair of electrodes, and the near-infrared photoelectric conversion film 3 and the visible-light photoelectric conversion film 13 that are disposed between the pair of electrodes. In the near-infrared photoelectric conversion element 10Ab, the upper electrode 4, the visible-light photoelectric conversion film 13, the near-infrared photoelectric conversion film 3, and the lower electrode 2 are stacked from the top in this order. The near-infrared photoelectric conversion element 10Ab is the same as the above-described near-infrared photoelectric conversion element 10Aa illustrated in FIG. 4A except that the near-infrared photoelectric conversion element 10Ab includes the visible-light photoelectric conversion film 13 in which visible light is subjected to photoelectric conversion, and a detailed description is omitted here. Since the near-infrared photoelectric conversion element 10Ab includes the visible-light photoelectric conversion film 13 and the near-infrared photoelectric conversion film 3, the near-infrared photoelectric conversion element 10Ab can detect not only near-infrared light but also visible light.

In the near-infrared photoelectric conversion element 10Ab illustrated in FIG. 4B, the upper electrode 4, the visible-light photoelectric conversion film 13, the near-infrared photoelectric conversion film 3, and the lower electrode 2 are stacked in this order. Alternatively, the order of stacking of the visible-light photoelectric conversion film 13 and the near-infrared photoelectric conversion film 3 may be changed. The near-infrared photoelectric conversion element 10Ab includes two films, i.e., the visible-light photoelectric conversion film 13 and the near-infrared photoelectric conversion film 3. Alternatively, a photoelectric conversion material having sensitivity to visible light may be further added to the near-infrared photoelectric conversion film 3, so that visible light is subjected to photoelectric conversion.

Next, another example of the near-infrared photoelectric conversion element according to this embodiment will be described with reference to FIGS. 5 and 6. FIG. 5 is a schematic sectional view of a near-infrared photoelectric conversion element 10B which is another example of the photoelectric conversion element according to this embodiment. FIG. 6 is an example of an energy band diagram of the near-infrared photoelectric conversion element 10B. In the near-infrared photoelectric conversion element 10B illustrated in FIG. 5, the same components as those of the near-infrared photoelectric conversion element 10Aa illustrated in FIG. 4A are assigned the same reference numerals.

Figure 5:
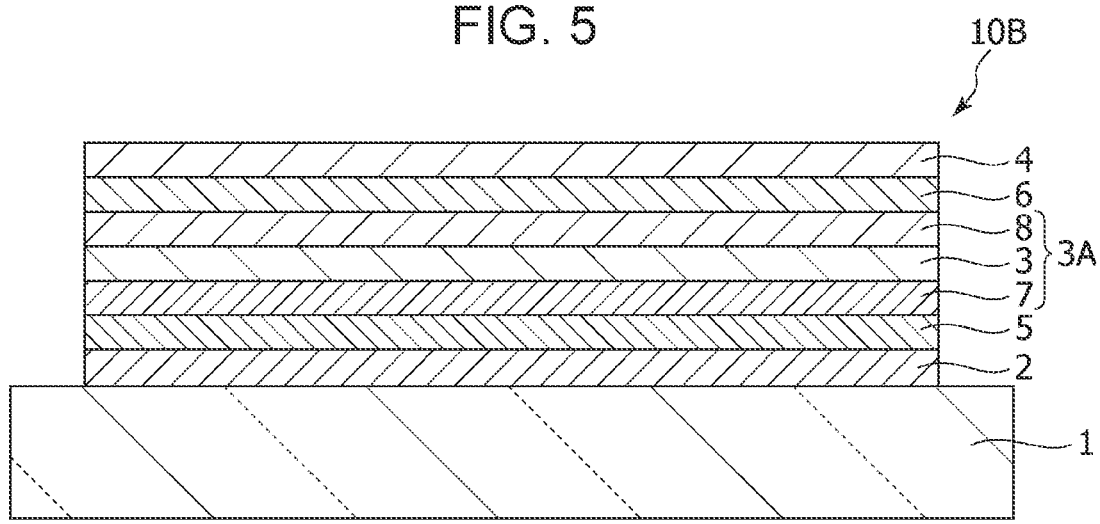
FIG. 5 is a schematic sectional view illustrating another example of a near-infrared photoelectric conversion element according to an embodiment.
Figure 6:
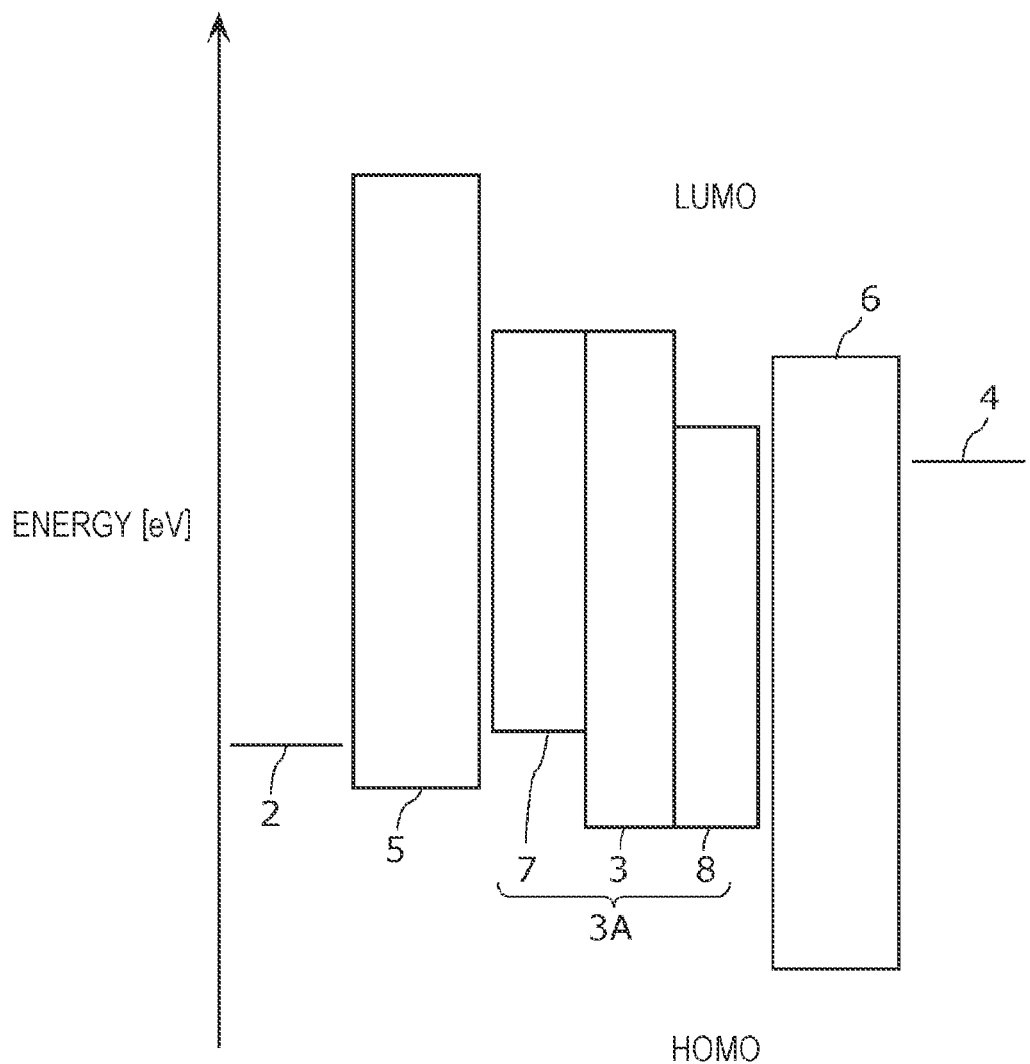
FIG. 6 is an example of an energy band diagram of the near-infrared photoelectric conversion element illustrated in FIG. 5.

As illustrated in FIG. 5, the near-infrared photoelectric conversion element 10B includes at least a lower electrode 2, an upper electrode 4, and a photoelectric conversion layer 3A disposed between the lower electrode 2 and the upper electrode 4. The photoelectric conversion layer 3A includes, for example, a near-infrared photoelectric conversion film 3, a p-type semiconductor layer 7 functioning as a hole transport layer, and an n-type semiconductor layer 8 functioning as an electron transport layer. The near-infrared photoelectric conversion film 3 is disposed between the p-type semiconductor layer 7 and the n-type semiconductor layer 8. The near-infrared photoelectric conversion element 10B further includes an electron-blocking layer 5 disposed between the lower electrode 2 and the photoelectric conversion layer 3A and a hole-blocking layer 6 disposed between the upper electrode 4 and the photoelectric conversion layer 3A. The near-infrared photoelectric conversion film 3 is the same as that described in the near-infrared photoelectric conversion element 10Aa illustrated in FIG. 1, and thus a description thereof is omitted here.

The photoelectric conversion layer 3A includes the near-infrared photoelectric conversion film 3, the p-type semiconductor layer 7, and the n-type semiconductor layer 8. Herein, at least one of a p-type semiconductor contained in the p-type semiconductor layer 7 or an n-type semiconductor contained in the n-type semiconductor layer 8 may be an organic semiconductor described later.

The photoelectric conversion layer 3A may include the photoelectric conversion material described above and at least one of an organic p-type semiconductor or an organic n-type semiconductor.

The photoelectric conversion layer 3A may include a bulk heterojunction structure layer in which a p-type semiconductor and an n-type semiconductor are mixed. When the photoelectric conversion layer 3A includes the bulk heterojunction structure layer, the shortcoming of a short carrier diffusion length in the photoelectric conversion layer 3A can be compensated for to improve the photoelectric conversion efficiency.

Furthermore, the photoelectric conversion layer 3A may include a bulk heterojunction structure layer between the p-type semiconductor layer 7 and the n-type semiconductor layer 8. When the bulk heterojunction structure layer is disposed between the p-type semiconductor layer 7 and the n-type semiconductor layer 8 in the near-infrared photoelectric conversion element 10B, the rectification of holes and electrons becomes higher than that in the bulk heterojunction structure layer to reduce the loss due to, for example, recombination of charge-separated holes and electrons, and a higher photoelectric conversion efficiency can be achieved. The bulk heterojunction structure layer is as described in Japanese Patent No. 5553727, in which a bulk hetero-type active layer is described in detail.

In the bulk heterojunction structure layer, the contact between the p-type semiconductor and the n-type semiconductor may generate electric charges in some cases even in a dark state.

There are two types of dark currents; a dark current due to thermal excitation across the HOMO-LUMO gap of the p-type semiconductor itself and a dark current due to thermal excitation from the HOMO of the p-type semiconductor to the LUMO of the n-type semiconductor.

The dark current due to thermal excitation across the HOMO-LUMO gap of the p-type semiconductor itself is improved by widening the HOMO-LUMO gap. The dark current due to thermal excitation from the HOMO of the p-type semiconductor to the LUMO of the n-type semiconductor is improved by making the HOMO of the p-type semiconductor deep or by making the LUMO of the n-type semiconductor shallow.

A reduction in the contact between the p-type semiconductor and the n-type semiconductor reduces the dark current. From the viewpoint of charge mobility, the element resistance is reduced when the bulk heterojunction structure layer contains a large amount of n-type semiconductor, such as a fullerene derivative, or a large amount of p-type semiconductor. In such a case, the volume ratio and weight ratio of the n-type semiconductor to the p-type semiconductor in the bulk heterojunction structure layer may be greater than or equal to four. Alternatively, the volume ratio and weight ratio of the p-type semiconductor to the n-type semiconductor in the bulk heterojunction structure layer may be greater than or equal to four (refer to, for example, Japanese Unexamined Patent Application Publication No. 2016-225456).

The organic p-type semiconductor is a donor organic semiconductor, is mainly typified by a hole-transporting organic compound, and is an organic compound having electron-donating properties. More specifically, the organic p-type semiconductor refers to one of two organic compounds that has lower ionization potential when the two organic compounds are used in contact with each other. Accordingly, any organic compound having electron-donating properties may be used as the donor organic semiconductor. Examples of the donor organic semiconductor that can be used include, but are not limited to, triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (such as naphthalene derivatives, anthracene derivatives, phenanthrene derivatives, tetracene derivatives, pyrene derivatives, perylene derivatives, and fluoranthene derivatives), and metal complexes having nitrogen-containing heterocyclic compounds as ligands. As described above, any organic compound having an ionization potential lower than that of an organic compound used as an acceptor organic semiconductor may be used as the donor organic semiconductor.

The organic n-type semiconductor is an acceptor organic semiconductor, is mainly typified by an electron-transporting organic compound, and is an organic compound having electron-accepting properties. More specifically, the organic n-type organic semiconductor refers to one of two organic compounds that has higher electron affinity when the two organic compounds are used in contact with each other. Accordingly, any organic compound having electron-accepting properties may be used as the acceptor organic semiconductor. Examples of the acceptor organic semiconductor that can be used include, but are not limited to, fullerenes, fullerene derivatives, fused aromatic carbocyclic compounds (such as naphthalene derivatives, anthracene derivatives, phenanthrene derivatives, tetracene derivatives, pyrene derivatives, perylene derivatives, and fluoranthene derivatives), nitrogen-, oxygen-, and/or sulfur-atom-containing five- to seven-membered heterocyclic compounds (such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine), polyarylene compounds, fluorene compounds, cyclopentadiene compounds, silyl compounds, and metal complexes having nitrogen-containing heterocyclic compounds as ligands. As described above, any organic compound having an electron affinity higher than that of an organic compound used as the donor organic semiconductor may be used as the acceptor organic semiconductor.

The electron-blocking layer 5 is provided to reduce the dark current due to the injection of electrons from the lower electrode 2 and suppresses the injection of electrons from the lower electrode 2 into the photoelectric conversion layer 3A. The electron-blocking layer 5 may be formed of the above p-type semiconductor or the above hole-transporting organic compound. As illustrated in FIG. 6, the electron-blocking layer 5 has a HOMO energy level lower than that of the p-type semiconductor layer 7 of the photoelectric conversion layer 3A and a LUMO energy level higher than that of the p-type semiconductor layer 7. In other words, the photoelectric conversion layer 3A has a HOMO energy level higher than that of the electron-blocking layer 5 and a LUMO energy level lower than that of the electron-blocking layer 5 in the vicinity of the interface between the photoelectric conversion layer 3A and the electron-blocking layer 5.

The hole-blocking layer 6 is provided to reduce the dark current due to the injection of holes from the upper electrode 4 and suppresses the injection of holes from the upper electrode 4 into the photoelectric conversion layer 3A. The material of the hole-blocking layer 6 may be, for example, an organic substance such as copper phthalocyanine, 3,4,9,10-perylenetetracarboxylic dianhydride (PTCDA), an acetylacetonate complex, bathocuproine (BCP), or tris(8-quinolinolate) aluminum (Alq); an organic-metal compound; or an inorganic substance such as MgAg or MgO. The hole-blocking layer 6 may have a high transmittance for near-infrared light so as not to prevent the light absorption of the photoelectric conversion film 3. For example, a material having no absorption in the visible light region may be selected, or the thickness of the hole-blocking layer 6 may be reduced. The thickness of the hole-blocking layer 6 depends on the configuration of the photoelectric conversion layer 3A, the thickness of the upper electrode 4, or the like and may be, for example, greater than or equal to 2 nm and less than or equal to 50 nm. The hole-blocking layer 6 may be formed of the above n-type semiconductor or the above electron-transporting organic compound.

In the case of providing the electron-blocking layer 5, the material of the lower electrode 2 is selected from the materials described above in consideration of, for example, adhesion to the electron-blocking layer 5, electron affinity, ionization potential, and stability. This also applies to the upper electrode 4.

As illustrated in FIG. 6, when the upper electrode 4 has a relatively large work function (for example, 4.8 eV), a barrier to the movement of holes to the photoelectric conversion film 3 during the application of a bias voltage is low. It is considered that, consequently, the holes are easily injected from the upper electrode 4 into the photoelectric conversion layer 3A, resulting in an increase in the dark current. In this embodiment, the presence of the hole-blocking layer 6 reduces the dark current.

Imaging Device

Figure 7:
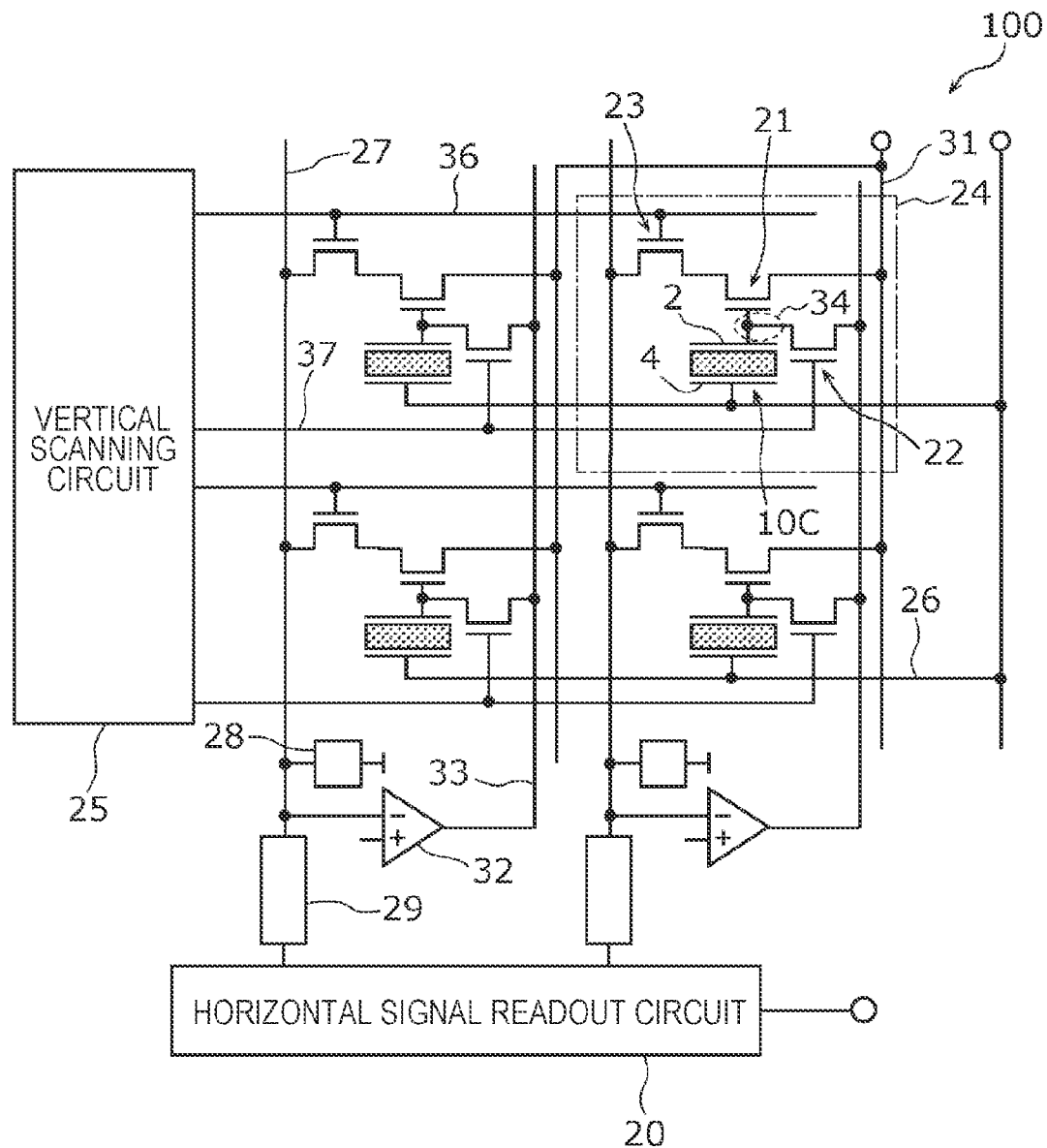
FIG. 7 is a diagram illustrating an example of a circuit configuration of an imaging device according to an embodiment.
Figure 8:
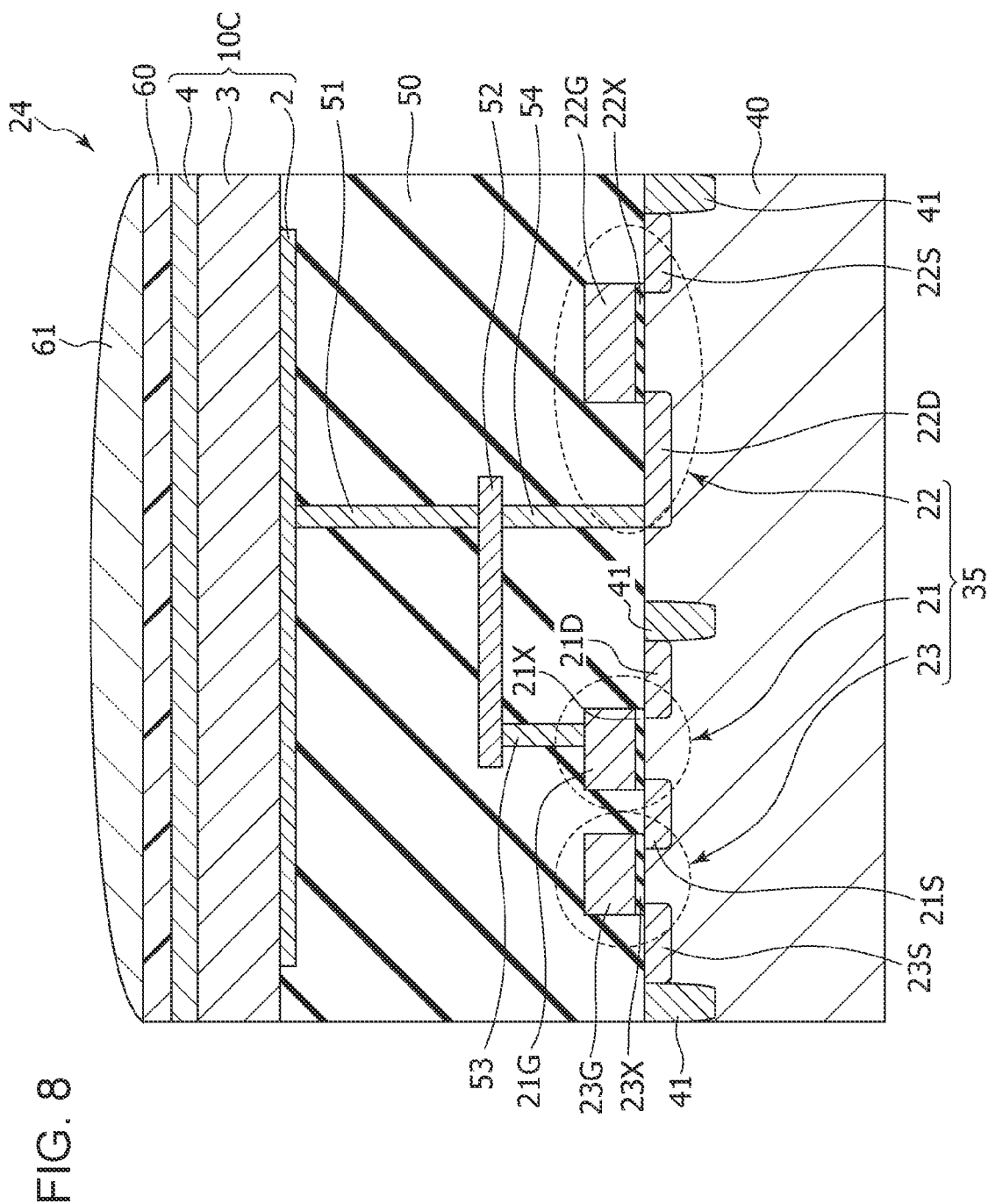
FIG. 8 is a schematic sectional view illustrating an example of the device structure of a pixel in an imaging device according to an embodiment.

Hereafter, an imaging device according to this embodiment will be described with reference to FIGS. 7 and 8. FIG. 7 is a diagram illustrating an example of a circuit configuration of an imaging device 100 according to this embodiment. FIG. 8 is a schematic sectional view illustrating an example of the device structure of a pixel 24 in the imaging device 100 according to this embodiment.

As illustrated in FIGS. 7 and 8, the imaging device 100 according to this embodiment includes a semiconductor substrate 40 which is a substrate, a charge detection circuit 35 disposed on or in the semiconductor substrate 40, and a pixel 24 including a photoelectric converter 10C disposed on the semiconductor substrate 40 and including a near-infrared photoelectric conversion element 10Aa, 10Ab, or 10B, and a charge storage node 34 that is electrically connected to the charge detection circuit 35 and the photoelectric converter 10C. The charge storage node 34 stores electric charges obtained in the photoelectric converter 10C, and the charge detection circuit 35 detects the electric charges stored in the charge storage node 34. The charge detection circuit 35 disposed on or in the semiconductor substrate 40 may be disposed on the semiconductor substrate 40 or may be disposed directly in the semiconductor substrate 40.

As illustrated in FIG. 7, the imaging device 100 includes a plurality of pixels 24 and peripheral circuits such as a vertical scanning circuit 25 and a horizontal signal readout circuit 20. The imaging device 100 is an organic image sensor implemented with a single-chip integrated circuit and includes a pixel array including the plurality of pixels 24 that are two-dimensionally arranged.

The plurality of pixels 24 are arranged two-dimensionally, that is, in row and column directions, on the semiconductor substrate 40 to form a photosensitive region (a so-called pixel region). FIG. 7 illustrates an example in which the pixels 24 are arranged in a matrix of two rows and two columns. In FIG. 7, a circuit (for example, a pixel electrode control circuit) for individually setting the sensitivity of the pixels 24 is omitted for convenience of illustration. The imaging device 100 may be a line sensor. In such a case, the plurality of pixels 24 may be one-dimensionally arranged. Herein, the terms "row direction" and "column direction" refer to the direction in which a row extends and the direction in which a column extends, respectively. That is, in FIG. 7, the vertical direction in the drawing is the column direction and the horizontal direction in the drawing is the row direction.

As illustrated in FIG. 7, each of the pixels 24 includes the photoelectric converter 10C and the charge storage node 34 that is electrically connected to the charge detection circuit 35. The charge detection circuit 35 includes an amplification transistor 21, a reset transistor 22, and an address transistor 23.

The photoelectric converter 10C includes a lower electrode 2 provided as a pixel electrode and an upper electrode 4 provided as a counter electrode. The near-infrared photoelectric conversion element 10Aa, 10Ab, or 10B described above may be used in the photoelectric converter 10C. A predetermined bias voltage is applied to the upper electrode 4 through a counter electrode signal line 26.

The lower electrode 2 is connected to a gate electrode of the amplification transistor 21. Signal charges collected by the lower electrode 2 are stored in the charge storage node 34 located between the lower electrode 2 and the gate electrode of the amplification transistor 21. In this embodiment, the signal charges are holes. Alternatively, the signal charges may be electrons.

The signal charges stored in the charge storage node 34 are applied to the gate electrode of the amplification transistor 21 as a voltage corresponding to the amount of the signal charges. The amplification transistor 21 amplifies this voltage. The amplified voltage is selectively read out as a signal voltage by the address transistor 23. The reset transistor 22 has source/drain electrodes connected to the lower electrode 2 and resets the signal charges stored in the charge storage node 34. In other words, the reset transistor 22 resets the potential of the gate electrode of the amplification transistor 21 and the potential of the lower electrode 2.

In order to selectively perform the above-described operations in the plurality of pixels 24, the imaging device 100 includes power supply lines 31, vertical signal lines 27, address signal lines 36, and reset signal lines 37, and these lines are connected to the pixels 24. Specifically, the power supply lines 31 are connected to source/drain electrodes of the amplification transistors 21, and the vertical signal lines 27 are connected to source/drain electrodes of the address transistors 23. The address signal lines 36 are connected to gate electrodes of the address transistors 23. The reset signal lines 37 are connected to gate electrodes of the reset transistors 22.

The peripheral circuits include the vertical scanning circuit 25, the horizontal signal readout circuit 20, a plurality of column signal processing circuits 29, a plurality of load circuits 28, and a plurality of differential amplifiers 32. The vertical scanning circuit 25 is also referred to as a row scanning circuit. The horizontal signal readout circuit 20 is also referred to as a column scanning circuit. The column signal processing circuits 29 are also referred to as row signal storage circuits. The differential amplifiers 32 are also referred to as feedback amplifiers.

The vertical scanning circuit 25 is connected to the address signal lines 36 and the reset signal lines 37, selects a plurality of pixels 24 arranged in each row in units of row, reads out the signal voltages, and resets the potentials of the lower electrodes 2. The power supply lines 31, which are source-follower power supplies, supply a predetermined power supply voltage to each pixel 24. The horizontal signal readout circuit 20 is electrically connected to the plurality of column signal processing circuits 29. The column signal processing circuits 29 are electrically connected to the pixels 24 arranged in respective columns through the vertical signal lines 27 corresponding to the columns. Each of the load circuits 28 is electrically connected to the corresponding vertical signal line 27. The load circuits 28 and the amplification transistors 21 form source follower circuits.

The plurality of differential amplifiers 32 are disposed so as to correspond to each column. A negative-side input terminal of each of the differential amplifiers 32 is connected to the corresponding vertical signal line 27. An output terminal of the differential amplifier 32 is connected to the pixels 24 through a feedback line 33 corresponding to the column.

The vertical scanning circuit 25 applies row selection signals that control the on and off states of the address transistors 23 to the gate electrodes of the address transistors 23 through the address signal lines 36. Thus, a row to be read out is scanned and selected. Signal voltages are read out from the pixels 24 in the selected row to the vertical signal lines 27. In addition, the vertical scanning circuit 25 applies reset signals that control the on and off states of the reset transistors 22 to the gate electrodes of the reset transistors 22 through the reset signal lines 37. Thus, a row of the pixels 24 to be reset is selected. The vertical signal lines 27 transmit the signal voltages read out from the pixels 24 selected by the vertical scanning circuit 25 to the column signal processing circuits 29.

The column signal processing circuits 29 perform, for example, noise reduction signal processing typified by correlated double sampling, and analog-to-digital conversion (AD conversion).

The horizontal signal readout circuit 20 sequentially reads out signals from the plurality of column signal-processing circuits 29 to a horizontal common signal line (not illustrated).

The differential amplifiers 32 are connected to the drain electrodes of the reset transistors 22 through the feedback lines 33. Accordingly, when the address transistors 23 and the reset transistors 22 are in the conduction state, negative terminals of the differential amplifiers 32 receive output values from the address transistors 23. The differential amplifiers 32 perform a feedback operation such that the gate potential of each of the amplification transistors 21 is equal to a predetermined feedback voltage. In this feedback operation, the value of the output voltage of each of the differential amplifiers 32 is 0 V or a positive voltage close to 0 V. The "feedback voltage" refers to the output voltage of the differential amplifier 32.

FIG. 8 is a schematic sectional view illustrating an example of the device structure of a pixel 24 in the imaging device 100 according to this embodiment.

As illustrated in FIG. 8, the pixel 24 includes a semiconductor substrate 40, a charge detection circuit 35, a photoelectric converter 10C, and a charge storage node 34 (refer to FIG. 7).

The semiconductor substrate 40 may be, for example, an insulating substrate having a semiconductor layer on a surface on the side where a photosensitive region (a so-called pixel region) is to be formed and is, for example, a p-type silicon substrate. The semiconductor substrate 40 includes impurity regions (n-type regions in this example) 21D, 21S, 22D, 22S, and 23S and an element isolation region 41 for electrically separating the pixels 24 from each other. In this example, the element isolation region 41 is also disposed between the impurity region 21D and the impurity region 22D. This configuration suppresses the leakage of the signal charges stored in the charge storage node 34. The element isolation region 41 is formed by, for example, implantation of acceptor ions under predetermined implantation conditions.

The impurity regions 21D, 21S, 22D, 22S, and 23S are typically diffusion layers formed in the semiconductor substrate 40. As illustrated in FIG. 8, the amplification transistor 21 includes the impurity regions 21S and 21D and a gate electrode 21G. The impurity region 21S and the impurity region 21D function as, for example, a source region and a drain region, respectively, of the amplification transistor 21. A channel region of the amplification transistor 21 is formed between the impurity regions 21S and 21D.

Similarly, the address transistor 23 includes the impurity regions 23S and 21S and a gate electrode 23G connected to one of the address signal lines 36. In this example, the amplification transistor 21 and the address transistor 23 are electrically connected to each other by sharing the impurity region 21S. The impurity region 23S functions as, for example, a source region of the address transistor 23. The impurity region 23S has a connection to one of the vertical signal lines 27 illustrated in FIG. 7.

The reset transistor 22 includes the impurity regions 22D and 22S and a gate electrode 22G connected to one of the reset signal lines 37. The impurity region 22S functions as, for example, a source region of the reset transistor 22. The impurity region 22S has a connection to one of the reset signal lines 37 illustrated in FIG. 7.

An interlayer insulating layer 50 is disposed on the semiconductor substrate 40 so as to cover the amplification transistor 21, the address transistor 23, and the reset transistor 22.

Wiring layers (not illustrated) may be disposed in the interlayer insulating layer 50. The wiring layers are typically formed of a metal such as copper and may include as a part thereof, for example, wiring lines such as the vertical signal lines 27 described above. The number of insulating layers in the interlayer insulating layer 50 and the number of layers included in the wiring layers disposed in the interlayer insulating layer 50 can be freely determined.

A contact plug 54 connected to the impurity region 22D of the reset transistor 22, a contact plug 53 connected to the gate electrode 21G of the amplification transistor 21, a contact plug 51 connected to the lower electrode 2, and a wiring line 52 that connects the contact plugs 51, 54, and 53 together are disposed in the interlayer insulating layer 50. With this configuration, the impurity region 22D, which functions as a drain electrode of the reset transistor 22, is electrically connected to the gate electrode 21G of the amplification transistor 21.

The charge detection circuit 35 detects signal charges captured by the lower electrode 2 and outputs a signal voltage. The charge detection circuit 35 includes the amplification transistor 21, the reset transistor 22, and the address transistor 23 and is formed on or in the semiconductor substrate 40.

The amplification transistor 21 includes the impurity regions 21D and 21S that are formed in the semiconductor substrate 40 and that function as a drain electrode and a source electrode, respectively, a gate insulating layer 21X formed on the semiconductor substrate 40, and the gate electrode 21G formed on the gate insulating layer 21X.

The reset transistor 22 includes impurity regions 22D and 22S that are formed in the semiconductor substrate 40 and that function as a drain electrode and a source electrode, respectively, a gate insulating layer 22X formed on the semiconductor substrate 40, and the gate electrode 22G formed on the gate insulating layer 22X.

The address transistor 23 includes impurity regions 21S and 23S that are formed in the semiconductor substrate 40 and that function as a drain electrode and a source electrode, respectively, a gate insulating layer 23X formed on the semiconductor substrate 40, and the gate electrode 23G formed on the gate insulating layer 23X. The impurity region 21S is shared by the amplification transistor 21 and the address transistor 23, and the amplification transistor 21 and the address transistor 23 are thereby connected in series.

The photoelectric converter 10C described above is disposed on the interlayer insulating layer 50. In other words, in this embodiment, the plurality of pixels 24 forming the pixel array are formed on the semiconductor substrate 40. The plurality of pixels 24 that are two-dimensionally arranged on the semiconductor substrate 40 form the photosensitive region, which is the pixel region. The pixel pitch that is the distance between two adjacent pixels 24 may be, for example, about 2 μm.

The photoelectric converter 10C includes the structure of the near-infrared photoelectric conversion element 10Aa, 10Ab, or 10B described above.

A color filter 60 is disposed over the photoelectric converter 10C, and a microlens 61 is disposed over the color filter 60. The color filter 60 is formed as, for example, an on-chip color filter produced by patterning and is formed of, for example, a photosensitive resin containing a dye or pigment dispersed therein. The microlens 61 is provided as, for example, an on-chip microlens and is formed of, for example, an ultraviolet photosensitive material. In the case of imaging in the near-infrared region, at least one type of color filters may transmit near-infrared light.

The imaging device 100 can be manufactured by a general semiconductor manufacturing process. In particular, when a silicon substrate is used as the semiconductor substrate 40, various silicon semiconductor processes can be used to manufacture the imaging device 100.

As described above, according to this embodiment, a camera system includes a light source having a peak emission wavelength at room temperature in a near-infrared region; and an imaging device including a near-infrared photoelectric conversion element which has spectral sensitivity at the peak emission wavelength, which has, at a wavelength longer than the peak emission wavelength, a first spectral sensitivity peak having an external quantum efficiency higher than an external quantum efficiency at the peak emission wavelength, and in which an external quantum efficiency at a wavelength 200 nm longer than the wavelength of the first spectral sensitivity peak is less than 1%. This configuration can realize a camera system that exhibits good imaging characteristics even when a peak shift of the emission wavelength and a change in the radiant intensity of a near-infrared light source are caused by, for example, a temperature change.

EXAMPLES

Near-infrared photoelectric conversion elements and camera systems according to the present disclosure will now be specifically described by way of Examples. However, the present disclosure is not limited only to the Examples below.

A composition containing a compound obtained in Example 1 is used to form near-infrared photoelectric conversion films in Examples 3 and 4, the near-infrared photoelectric conversion films having different composition ratios of the compound. A composition containing a compound obtained in Example 2 is used to form a near-infrared photoelectric conversion film in Example 5. Near-infrared photoelectric conversion elements including the near-infrared photoelectric conversion films obtained in Examples 3, 4, and 5 are referred to as near-infrared photoelectric conversion elements in Examples 6, 7, and 8, respectively.

Hereinafter, a phenyl group is represented by Ph, $C_4H_9$ is represented by Bu, $C_5H_{11}$ is represented by Pent, $C_{48}H_{26}N_8$ is represented by Nc, and $C_{32}H_{18}N_8$ is represented by Pc in some cases.

Naphthalocyanine Derivative and Phthalocyanine Derivative

A naphthalocyanine derivative and a phthalocyanine derivative that are included in photoelectric conversion elements in camera systems according to the present disclosure will be more specifically described below with reference to Examples 1 and 2.

Example 1

Synthesis of $(OBu)_8Si(OPOPh_2)_2Nc$

A compound $(OBu)_8Si(OPOPh_2)_2Nc$, which is represented by the following structural formula, was synthesized in accordance with Steps (1) and (2) described below.

(1) Synthesis of (OBu)₈Si(OH)₂Nc (Compound (A-2))

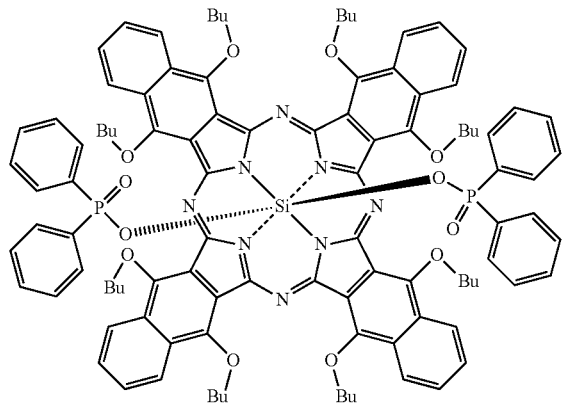

This synthesis was performed with reference to MOHAMED AOUDIA et al., "Synthesis of a Series of Octabutoxy- and Octabutoxybenzophthalocyanines and Photophysical Properties of Two Members of the Series", Journal of American Chemical Society, American Chemical Society, 1997, Vol. 119, No. 26, pp. 6029-6039 (Non-Patent Literature 3).

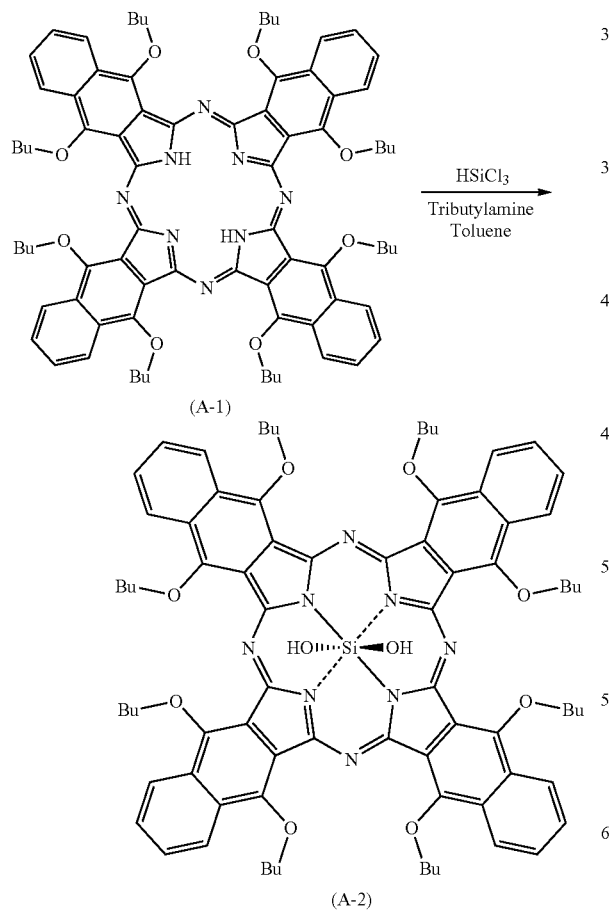

To a 1,000 mL reaction vessel purged with argon, 0.95 g of (OBu)₈H₂Nc (Compound (A-1)), 92 mL of tributylamine, and 550 mL of dehydrated toluene were added, 3.7 mL of HSiCl₃ was added, and the resulting reaction solution was heated at 80° C. under stirring for 24 hours. Subsequently, the reaction solution was allowed to cool to room temperature, 3.7 mL of HSiCl₃ was added thereto, and the reaction solution was heated at 80° C. under stirring for 24 hours. Subsequently, the reaction solution was allowed to cool to room temperature, 1.9 mL of HSiCl₃ was added thereto, and the reaction solution was heated at 80° C. under stirring for 24 hours.

The reaction solution was allowed to cool to room temperature, 360 mL of distilled water was added to the reaction solution, and the reaction solution was stirred for one hour. Next, 180 mL of triethylamine was added thereto, and the reaction solution was extracted with 100 mL of toluene four times. The extracted organic layer was washed with distilled water. The organic layer was concentrated to obtain a 1.54 g of a crude product. The crude product was purified by a neutral alumina column to obtain (OBu)₈Si(OH)₂Nc (Compound (A-2)) in the form of a brown solid. The amount of this compound obtained above was 0.53 g, and the yield thereof was 50%.

(2) Synthesis of (OBu)₈Si(OPOPh₂)₂Nc (Compound (A-3))

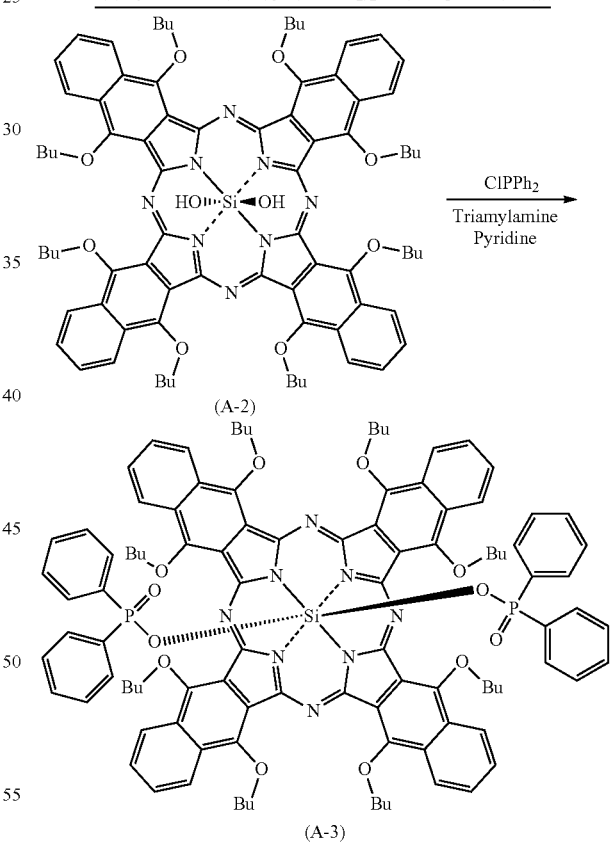

To a 200 mL reaction vessel purged with argon, 0.13 g of (OBu)₈Si(OH)₂Nc (Compound (A-2)) synthesized in Step (1), 1.3 g of chlorodiphenylphosphine, and 1.3 g of triamylamine were added, and the mixture was dissolved in 10 mL of pyridine. The resulting reaction solution was refluxed under heating at 110° C. for five hours. After the reaction solution was cooled to room temperature, 10 mL of water was added thereto, and the resulting reaction mixture was stirred for 30 minutes. Further, 20 mL of water was added to the reaction mixture to precipitate a solid component. The precipitated solid component was collected by filtration. The solid component collected by filtration was purified by silica gel column chromatography (toluene:ethyl acetate=1:1), and the resulting purified product was further reprecipitated with methanol. The precipitated product was dried under reduced pressure at 100° C. for three hours to obtain the target compound (OBu)$_8$Si(OPOPh$_2$)$_2$Nc (Compound (A-3)). The amount of the target compound obtained above was 83 mg, and the yield thereof was 50%.

The obtained compound was identified by proton nuclear magnetic resonance spectroscopy (1HNMR) and matrix-assisted laser desorption/ionization time-of-flight mass spectrometry (MALDI-TOF MS). The results are as shown below.

$^1$HNMR (400 MHz, C$_6$D$_6$): δ (ppm)=9.16 (8H), 7.62 (8H), 6.13 (12H), 6.00 (8H), 5.29 (16H), 2.26 (16H), 1.64 (16H), 1.00 (24H)

MALDI-TOF-MS measured value: m/z=1,751.17 (M$^+$)

The chemical formula of the target compound is C$_{104}$H$_{108}$N$_8$O$_{12}$P$_2$Si, and the exact mass thereof is 1,750.73.

The above results showed that the target compound was obtained by the above synthesis procedure.

Example 2

Synthesis of (S-Pent)$_8$Si(OPOPh$_2$)$_2$Pc

A compound (S-Pent)$_8$Si(OPOPh$_2$)$_2$Pc, which is represented by the following general formula, was synthesized in accordance with Steps (3) to (5) described below.

(3) Synthesis of S-Pent isoindoline derivative (Compound (A-5))

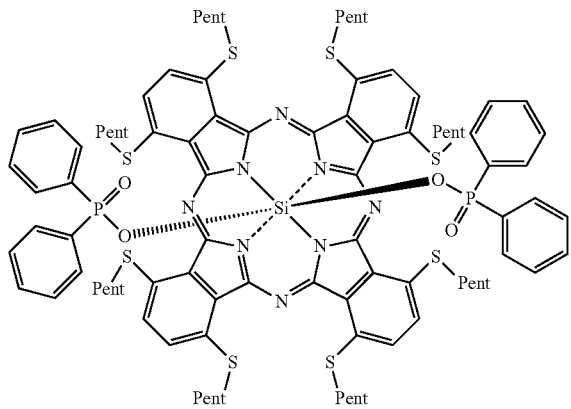

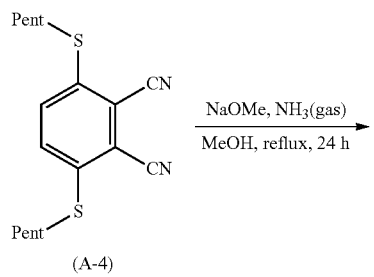

(A-4)

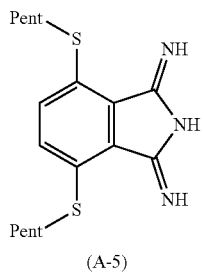

(A-5)

3,6-Dipentylthio-4,5-dicyanobenzene (Compound (A-4)) used as a raw material was synthesized with reference to a synthesis method described in Gcineka Mbambisa et al., "Synthesis and electrochemical properties of purple manganese(III) and red titanium(IV) phthalocyanine complexes octa-substituted at non-peripheral positions with pentylthio groups", Polyhedron, 2007, vol. 26, Issue 18, pp. 5355-5364 (Non-Patent Literature 4).

To a 1,000 mL reaction vessel, 7.2 g of 3,6-dipentylthio-4,5-dicyanobenzene (Compound (A-4)), 450 mL of dehydrated methanol, and 1.5 g of a 38% solution of sodium methoxide in methanol (MeONa/MeOH) were added. The reaction solution was then stirred for 24 hours under heating and reflux while ammonia (NH$_3$) gas was bubbled into the reaction vessel. After the progress of reaction was confirmed by thin-layer chromatography (TLC), the reaction solution was cooled to room temperature. Subsequently, city water was added to the reaction solution, and the resulting mixture was subjected to separatory washing. Subsequently, the solvent was cooled to precipitate crystals, and the crystals were collected by filtration. Subsequently, the crystals collected by filtration were washed with methanol (MeOH) to obtain a solid. The solid was dried by heating at 60° C. for two days under reduced pressure. Thus, a solid target compound S-Pent isoindoline derivative (Compound (A-5)) was obtained. The amount of the target compound obtained above was 2.4 g, and the yield thereof was 32%.

(4) Synthesis of (SPent)$_8$Si(OH)$_2$Pc (Compound (A-6))

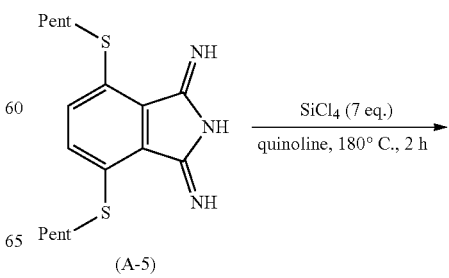

(A-5)

-continued

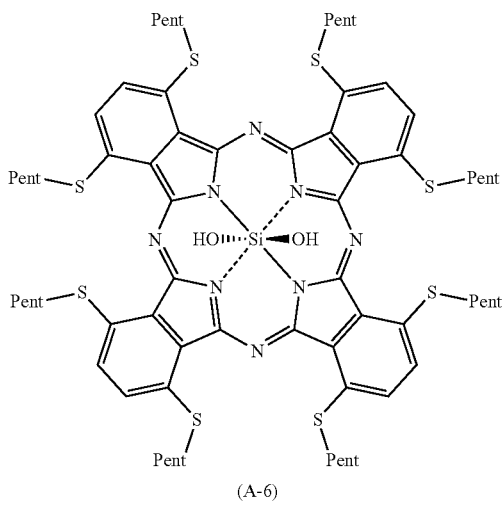

(A-6)

(5) Synthesis of (SPent)₈Si(OPOPh₂)₂Pc (Compound (A-7))

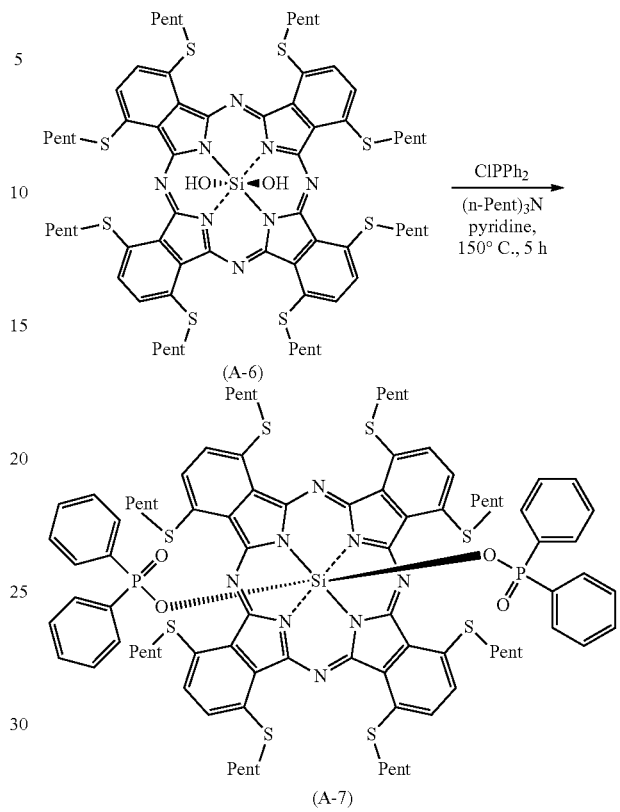

In an argon atmosphere, 1.05 g (3 mmol) of the S-Pent isoindoline derivative (Compound (A-5)) was dissolved in 6 mL of quinoline, and 2.4 mL (21 mmol) of silicon tetrachloride was then added to the solution at room temperature. The temperature of the reaction system was increased to 180° C., followed by stirring for two hours. An ultraviolet-visible absorption spectrum (UV-vis spectrum) of the reaction solution after two hours of reaction was measured to determine the concentration of the product. Subsequently, the reaction solution was cooled to room temperature, and a small amount of water was added to the reaction solution to terminate the reaction. Subsequently, a small amount of methanol and a large amount (about 50 mL) of chloroform were added to the reaction solution, and the reaction solution was stirred at room temperature for one hour. Subsequently, a produced insoluble mixture was removed by Celite filtration, and washing was further performed with chloroform until the filtrate became transparent. An organic layer was collected from the resulting filtrate by an extraction operation (chloroform) and was washed with water. The organic layer was then dried with magnesium sulfate. The magnesium sulfate was removed from the organic layer by filtration through a cotton plug, and the organic layer was then concentrated. After methanol (about 30 mL) was added to the resulting concentrate and the concentrate was left to stand for about half a day, a precipitate was collected by filtration. The precipitate was sufficiently washed with methanol and was then dried. Thus, a purple powdery target compound (SPent)₈Si(OH)₂Pc (Compound (A-6)) was obtained. The amount of the target compound obtained above was 420 mg, and the yield thereof was 40%.

To a 200 mL reaction vessel purged with argon, 0.3 g of (SPent)₈Si(OH)₂Pc (Compound (A-6)) synthesized in Step (4) and 3.0 g of chlorodiphenylphosphine were added, and the mixture was dissolved in 20 mL of dehydrated pyridine together with 3.0 g of tripentylamine. The resulting reaction solution was stirred at 150° C. for five hours. After the progress of reaction was confirmed by a UV-vis spectrum, the reaction solution was cooled to room temperature. Subsequently, the reaction solution was extracted with dichloromethane, 100 mL of city water was added thereto, and an organic layer was separated with a separatory funnel. The solvent was distilled off from the organic layer, resulting in precipitation of a solid. The solid was purified by silica gel column chromatography (developing solvent:toluene:ethyl acetate=2:1). Thus, a target compound (SPent)₈Si(OPOPh₂)₂Pc (Compound (A-7)) was obtained. The amount of the target compound obtained above was 80 mg, and the yield thereof was 21%.

The obtained compound was identified by $^1$HNMR and MALDI-TOF MS. The results are as shown below.

$^1$HNMR (400 MHz, CD₂Cl₂): δ (ppm)=7.883 (8H), 6.63 (4H), 6.41 (8H), 5.15 (8H), 3.37 (16H), 2.03 (16H), 1.66 (16H), 1.50 (16H), 0.99 (24H)

MALDI-TOF-MS measured value: m/z=1,790.92 (M⁻)

The chemical formula of the target compound is $C_{96}H_{116}N_8O_4S_8P_2Si$, and the exact mass thereof is 1,790.61.

The above results showed that the target compound was obtained by the above synthesis procedure.

Near-Infrared Photoelectric Conversion Film

Near-infrared photoelectric conversion films according to the present disclosure will be more specifically described below with reference to Examples 3 to 5.

Example 3

A quartz glass substrate having a thickness of 0.7 mm was used as a support substrate. The support substrate was coated, by a spin coating method, with a chloroform mixed solution prepared by mixing $(OBu)_8Si(OPOPh_2)_2Nc$ (Compound (A-3)) obtained in Example 1 and a [6,6]-phenyl-C61-butyric acid methyl ester (PCBM) derivative in a weight ratio of 1:9. Thus, a near-infrared photoelectric conversion film having a thickness of 216 nm and an ionization potential of 4.95 eV was obtained.

Method for Measuring Absorption Spectrum

Figure 9A:
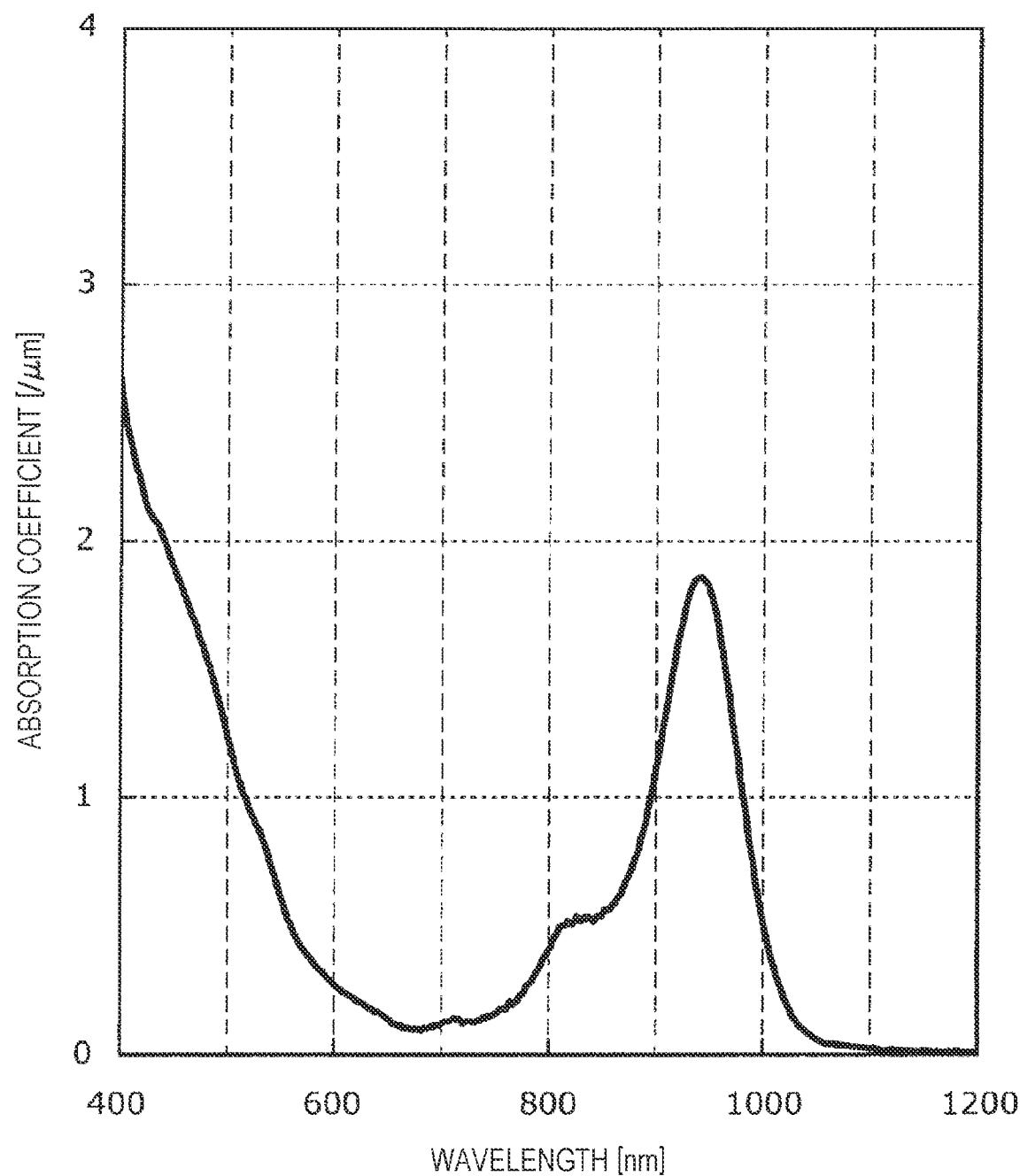
FIG. 9A is a graph of an absorption spectrum of a near-infrared photoelectric conversion film of Example 3.

An absorption spectrum of the near-infrared photoelectric conversion film obtained as described above was measured. A spectrophotometer (U4100, available from Hitachi High-Tech Science Corporation) was used for the measurement. The wavelength used to measure the absorption spectrum was in the range of from 400 nm to 1,200 nm. FIG. 9A shows the results.

As shown in FIG. 9A, the near-infrared photoelectric conversion film in Example 3 had an absorption peak at about 942 nm.

Method for Measuring Ionization Potential

Figure 9B:
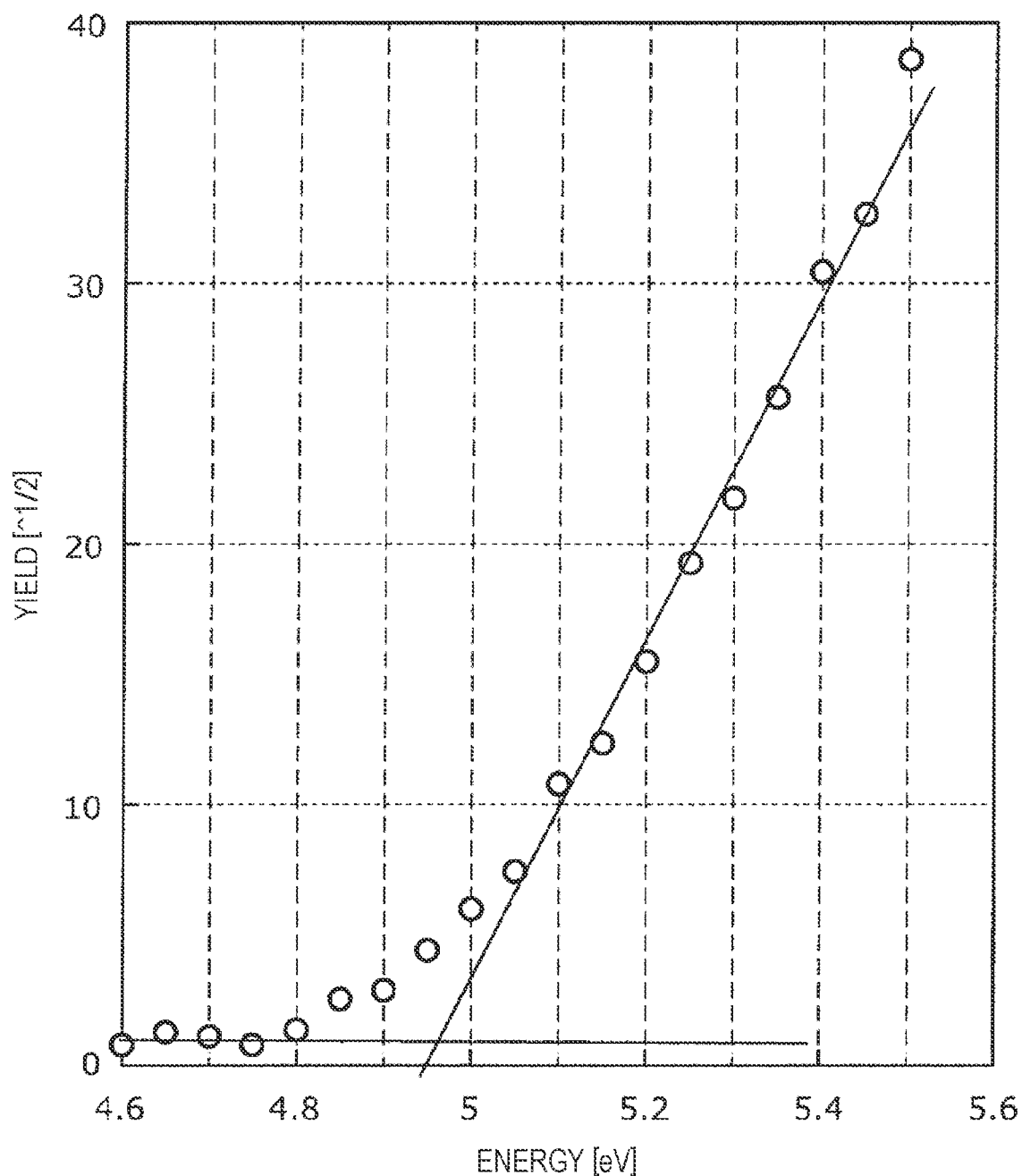
FIG. 9B is a graph illustrating results of photoelectron spectroscopy of the near-infrared photoelectric conversion film of Example 3.

An ionization potential of the near-infrared photoelectric conversion film obtained in Example 3 was measured. Specifically, a film of the composition containing the compound obtained in Example 1 in the above weight ratio was formed on an ITO substrate, and the ionization potential of the film was measured in air by using a photoelectron spectrometer (AC-3, available from Riken Keiki Co., Ltd.). FIG. 9B shows the results.

The ionization potential is measured in terms of the number of photoelectrons detected when the energy of ultraviolet irradiation is changed. Therefore, an energy position at which photoelectrons start to be detected can be determined as the ionization potential.

Example 4

Figure 10A:
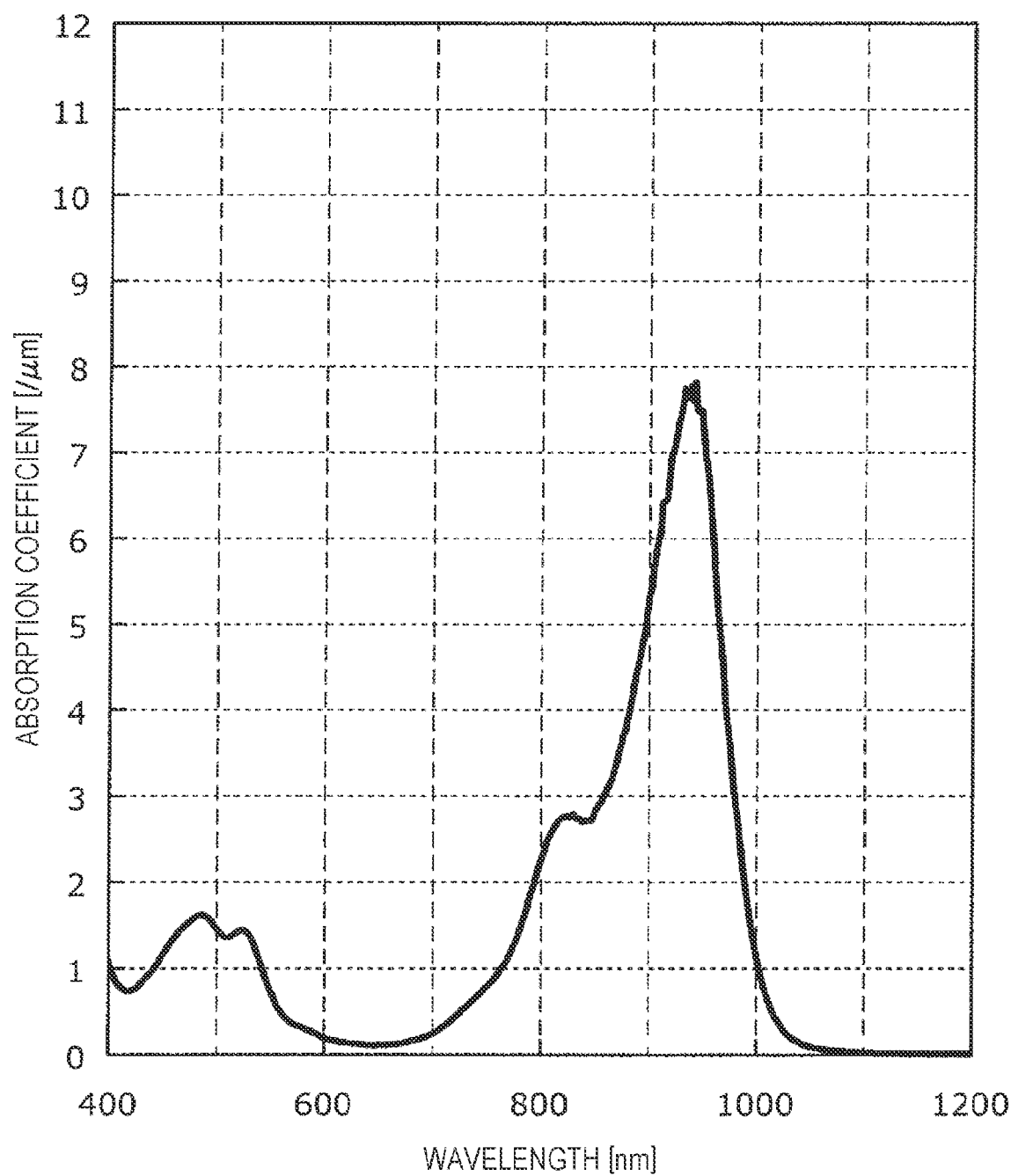
FIG. 10A is a graph of an absorption spectrum of a near-infrared photoelectric conversion film of Example 4.
Figure 10B:
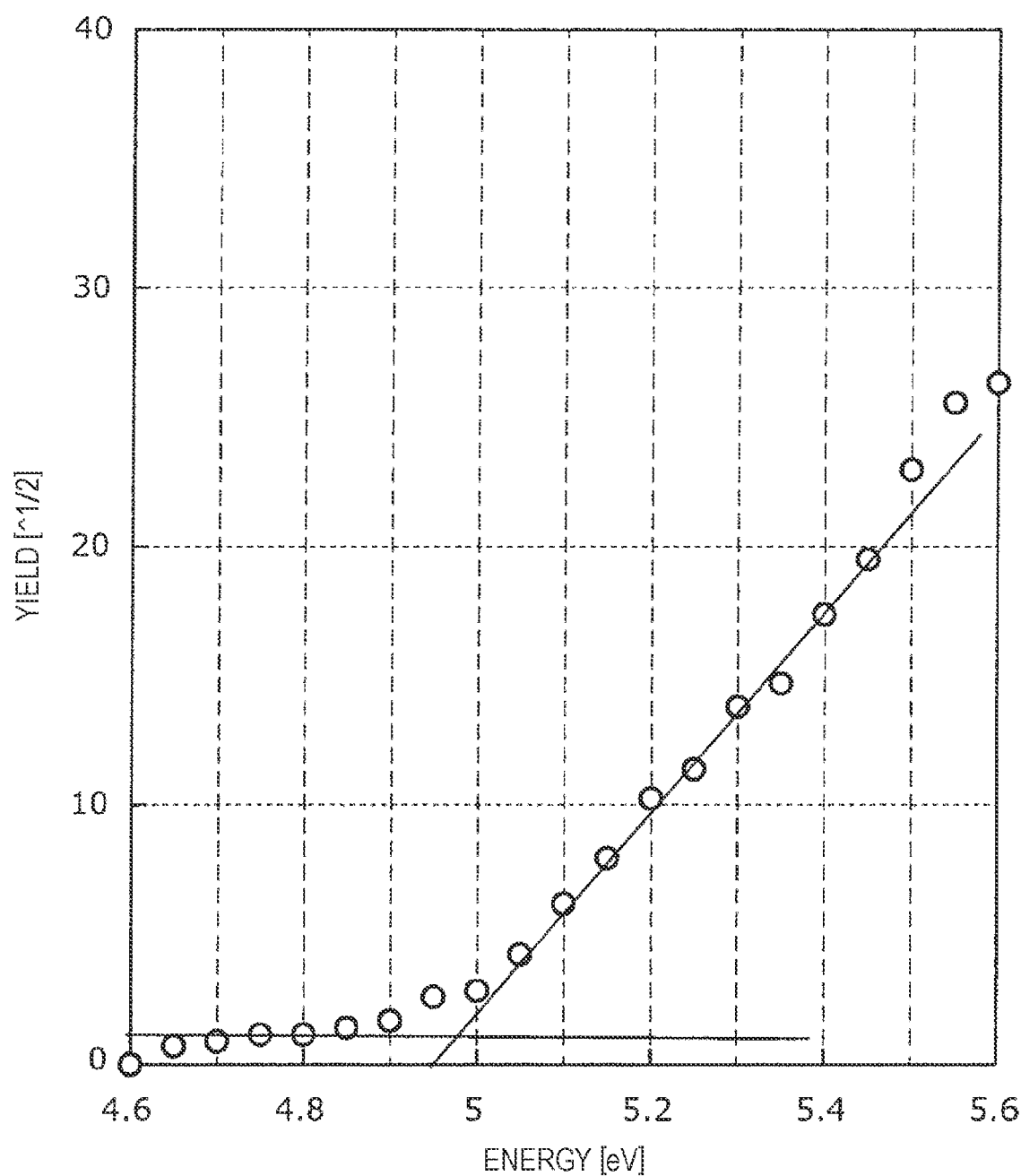
FIG. 10B is a graph illustrating results of photoelectron spectroscopy of the near-infrared photoelectric conversion film of Example 4.

A quartz glass substrate having a thickness of 0.7 mm was used as a support substrate. The support substrate was coated, by a spin coating method, with a chloroform mixed solution prepared by mixing $(OBu)_8Si(OPOPh_2)_2Nc$ (Compound (A-3)) obtained in Example 1 and a [6,6]-phenyl-C61-butyric acid methyl ester (PCBM) derivative in a weight ratio of 9:1. Thus, a near-infrared photoelectric conversion film having a thickness of 270 nm and an ionization potential of 4.95 eV was obtained. The absorption spectrum of the near-infrared photoelectric conversion film obtained as described above was measured by the same method as that used in Example 3. FIG. 10A shows the results. The ionization potential was measured by the same method as that used in Example 3 except that the weight ratio of the compound obtained in Example 1 was changed. FIG. 10B shows the results.

As shown in FIG. 10A, the near-infrared photoelectric conversion film in Example 4 had an absorption peak at about 942 nm.

Example 5

Figure 11A:
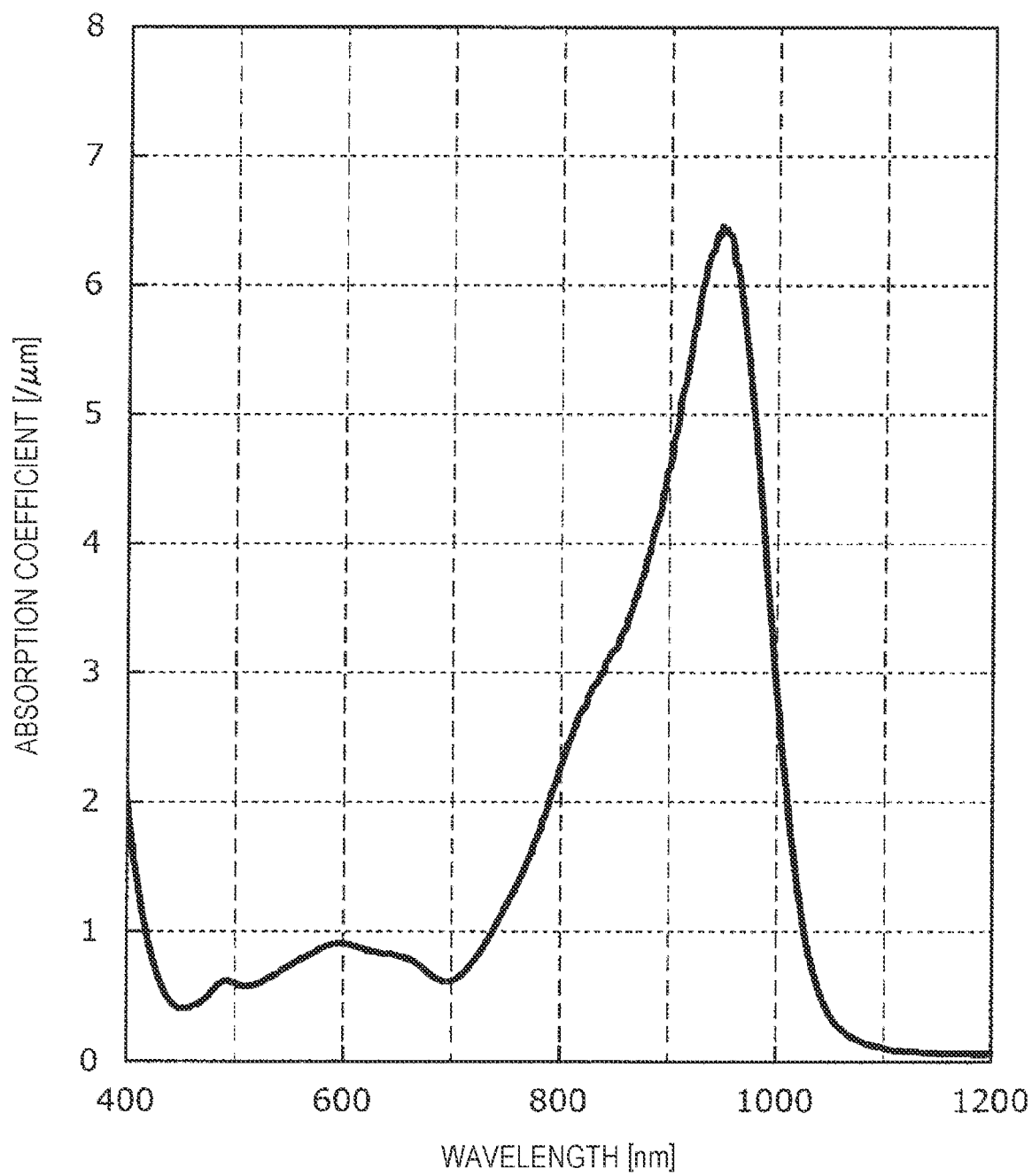
FIG. 11A is a graph of an absorption spectrum of a near-infrared photoelectric conversion film of Example 5.
Figure 11B:
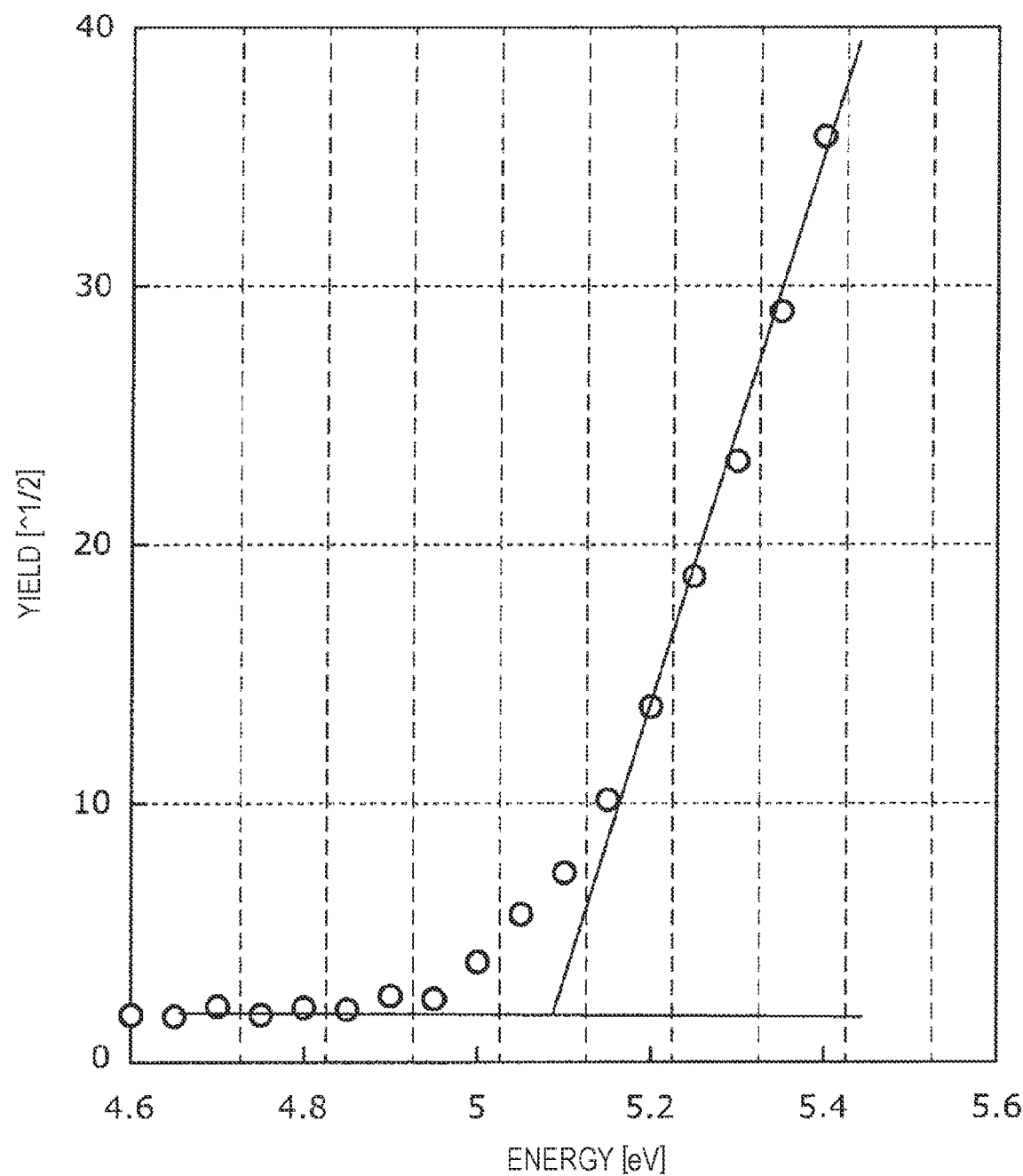
FIG. 11B is a graph illustrating results of photoelectron spectroscopy of the near-infrared photoelectric conversion film of Example 5.

A quartz glass substrate having a thickness of 0.7 mm was used as a support substrate. The support substrate was coated, by a spin coating method, with a chloroform mixed solution prepared by mixing $(SPent)_8Si(OPOPh_2)_2PC$ (Compound (A-7)) obtained in Example 2 and a [6,6]-phenyl-C61-butyric acid methyl ester (PCBM) derivative in a weight ratio of 9:1. Thus, a near-infrared photoelectric conversion film having a thickness of 246 nm and an ionization potential of 5.08 eV was obtained. The absorption spectrum of the near-infrared photoelectric conversion film obtained as described above was measured by the same method as that used in Example 3. FIG. 11A shows the results. The ionization potential was measured by the same method as that used in Example 4 except that the compound obtained in Example 2 was used. FIG. 11B shows the results.

As shown in FIG. 11A, the near-infrared photoelectric conversion film in Example 5 had an absorption peak at about 948 nm.

Near-Infrared Photoelectric Conversion Element

Near-infrared photoelectric conversion elements according to the present disclosure will be more specifically described below with reference to Examples 6 to 8.

Example 6

A glass substrate on which an ITO electrode with a thickness of 150 nm was deposited and which had a thickness of 0.7 mm was used as a substrate. The ITO electrode was used as a lower electrode. On the ITO electrode, a mixed film in which $(OBu)_8Si(OPOPh_2)_2Nc$ (Compound (A-3)) obtained in Example 1 and a PCBM derivative were mixed in a weight ratio of 1:9 was further formed as a photoelectric conversion layer so as to have a thickness of 216 nm. Furthermore, an Al electrode with a thickness of 80 nm was deposited as an upper electrode on the photoelectric conversion layer. The Al electrode was deposited in a vacuum of $5.0 \times 10^{-4}$ Pa or less at a vapor deposition rate of 1 Å/s.

Method for Measuring Spectral Sensitivity

Figure 12:
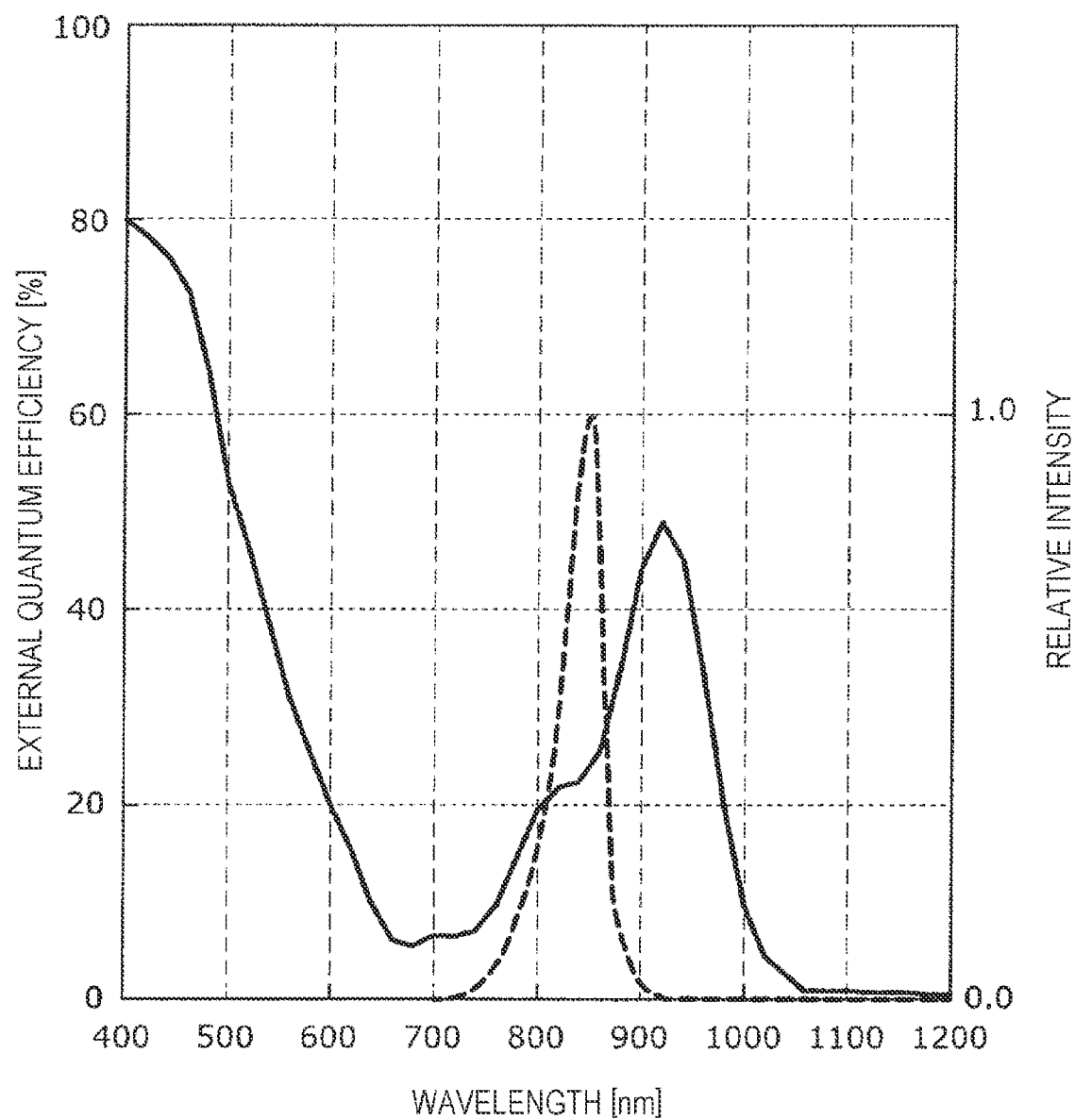
FIG. 12 is a graph illustrating measurement results of spectral sensitivity characteristics of a near-infrared photoelectric conversion element of Example 6.

Spectral sensitivity of the near-infrared photoelectric conversion element obtained as described above was measured. The measurement was conducted with a long wavelength-sensitive spectral sensitivity measurement device (CEP-25RR, available from Bunkoukeiki Co., Ltd.). More specifically, the near-infrared photoelectric conversion element was introduced into a measurement jig capable of hermetically sealing the element in a glove box under a nitrogen atmosphere, and the spectral sensitivity was measured. FIG. 12 shows the results.

As shown in FIG. 12, the external quantum efficiency (the vertical axis on the left side) of the near-infrared photoelectric conversion element in Example 6 in the near-infrared region was highest at a wavelength of about 920 nm, and the highest external quantum efficiency was about 49%. The external quantum efficiency at a wavelength of 1,120 nm, which is 200 nm longer than 920 nm corresponding to the spectral sensitivity peak wavelength, was 0.8%.

Example 7

Figure 13:
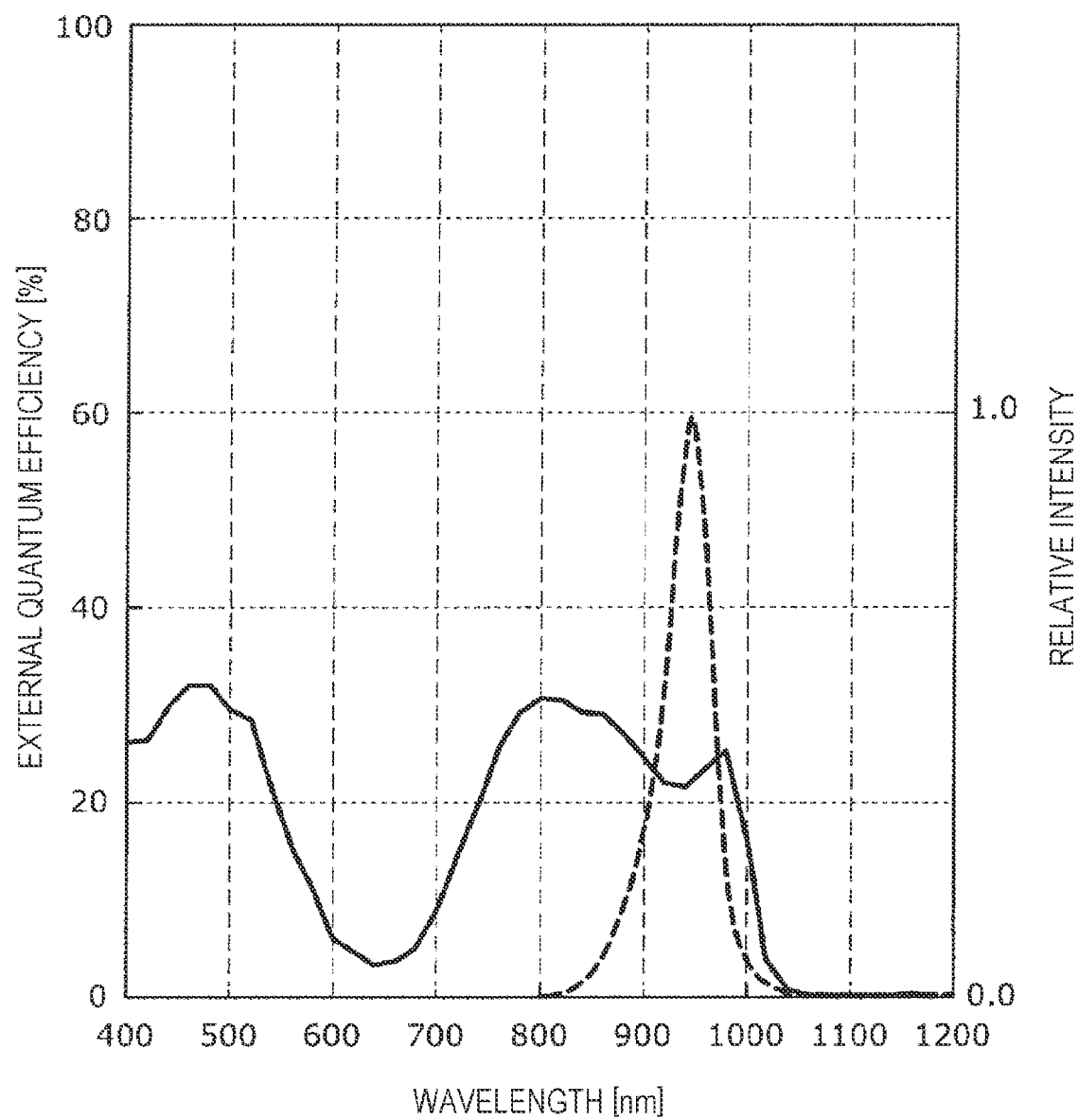
FIG. 13 is a graph illustrating measurement results of spectral sensitivity characteristics of a near-infrared photoelectric conversion element of Example 7.

A near-infrared photoelectric conversion element including a near-infrared photoelectric conversion film having a thickness of 270 nm was obtained as in Example 6 except that a mixed film in which $(OBu)_8Si(OPOPh_2)_2Nc$ (Compound (A-3)) and the PCBM derivative were mixed as the materials of the photoelectric conversion layer in a weight ratio of 9:1 was used. The spectral sensitivity of the near-infrared photoelectric conversion element obtained as described above was measured as in Example 6. FIG. 13 shows the results.

As shown in FIG. 13, the external quantum efficiency (the vertical axis on the left side) of the near-infrared photoelectric conversion element in Example 7 in the near-infrared region was highest at a wavelength of about 800 nm, and the highest external quantum efficiency was about 31%. The near-infrared photoelectric conversion element further had a spectral sensitivity peak at 980 nm, and the external quantum efficiency at the spectral sensitivity peak was about 25%. The external quantum efficiency at a wavelength of 1,180 nm, which is 200 nm longer than 980 nm corresponding to the spectral sensitivity peak wavelength on the long-wavelength side, was 0%.

Example 8

Figure 14:
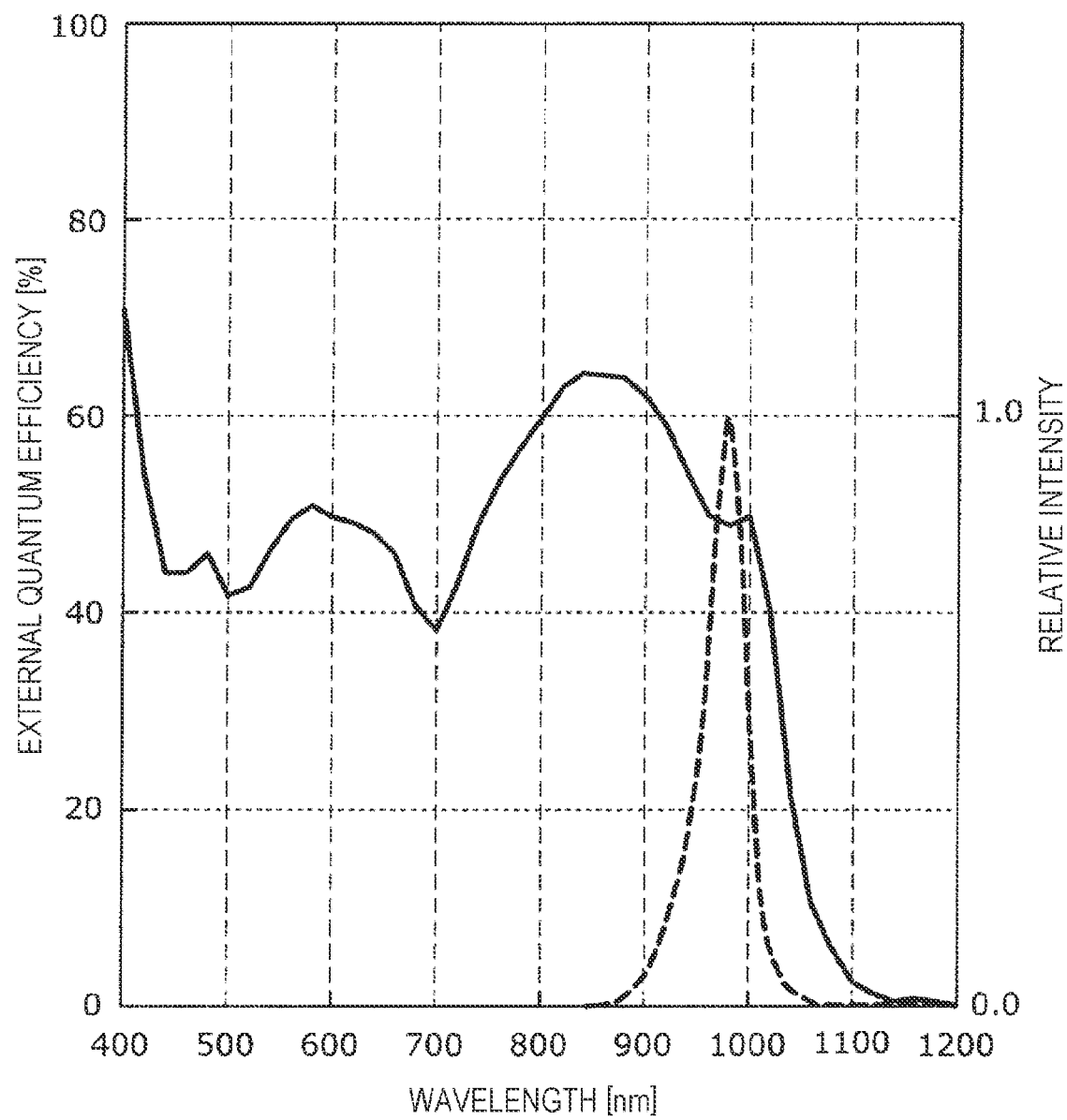
FIG. 14 is a graph illustrating measurement results of spectral sensitivity characteristics of a near-infrared photoelectric conversion element of Example 8.

A near-infrared photoelectric conversion element including a near-infrared photoelectric conversion film having a thickness of 246 nm was obtained as in Example 7 except that $(SPent)_8Si(OPOPh_2)_2PC$ (Compound (A-7)) obtained in Example 2 was used as a material of the photoelectric conversion layer instead of the compound obtained in Example 1. The spectral sensitivity of the near-infrared photoelectric conversion element obtained as described above was measured as in Example 6. FIG. 14 shows the results.

As shown in FIG. 14, the external quantum efficiency (the vertical axis on the left side) of the near-infrared photoelectric conversion element in Example 8 in the near-infrared region was highest at a wavelength of about 860 nm, and the highest external quantum efficiency was about 64%. The near-infrared photoelectric conversion element further had a spectral sensitivity peak at 1,000 nm, and the external quantum efficiency at the spectral sensitivity peak was about 50%. The external quantum efficiency at a wavelength of 1,200 nm, which is 200 nm longer than 1,000 nm corresponding to the spectral sensitivity peak wavelength on the long-wavelength side, was 0%.

CONCLUSIONS

As shown in FIGS. 9A to 11A, the near-infrared photoelectric conversion films of Examples 3, 4, and 5 had absorption peaks at 942 nm, 942 nm, and 948 nm, respectively, and the absorption coefficients at the absorption peaks in Examples 3, 4, and 5 were 1.8/1 am, 7.6/1 am, and 6.4/1 am, respectively.

According to these results, it was confirmed that near-infrared photoelectric conversion films had sensitivity to near-infrared light in the cases of using, as in Examples 3 to 5, a composition containing a naphthalocyanine derivative having an alkoxy group at an α-position of a naphthalocyanine skeleton and having, as an axial ligand, a phosphinate derivative having aryl groups that are independent from each other or a composition containing a phthalocyanine derivative having a thiol group at an α-position of a phthalocyanine skeleton.

As shown in FIG. 12, the external quantum efficiency of the near-infrared photoelectric conversion element in Example 6 in the near-infrared region was highest at a wavelength of about 920 nm, and the highest external quantum efficiency was about 49%. The external quantum efficiency at a wavelength of 1,120 nm, which is 200 nm longer than 920 nm corresponding to the spectral sensitivity peak wavelength, was 0.8%.

As shown in FIG. 13, the external quantum efficiency of the near-infrared photoelectric conversion element in Example 7 in the near-infrared region was highest at a wavelength of about 800 nm, and the highest external quantum efficiency was about 31%. The near-infrared photoelectric conversion element further had a spectral sensitivity peak at 980 nm, and the external quantum efficiency at the spectral sensitivity peak was about 25%. The external quantum efficiency at a wavelength of 1,180 nm, which is 200 nm longer than 980 nm corresponding to the spectral sensitivity peak wavelength on the long-wavelength side, was 0%.

As shown in FIG. 14, the external quantum efficiency of the near-infrared photoelectric conversion element in Example 8 in the near-infrared region was highest at a wavelength of about 860 nm, and the highest external quantum efficiency was about 64%. The near-infrared photoelectric conversion element further had a spectral sensitivity peak at 1,000 nm, and the external quantum efficiency at the spectral sensitivity peak was about 50%. The external quantum efficiency at a wavelength of 1,200 nm, which is 200 nm longer than 1,000 nm corresponding to the spectral sensitivity peak wavelength on the long-wavelength side, was 0%.

As described above, it is found that the near-infrared photoelectric conversion elements in Examples 6 to 8 each have a spectral sensitivity peak in the range of from 900 nm to 1,000 nm, and have an external quantum efficiency of less than 1% at a wavelength 200 nm longer than the wavelength of the spectral sensitivity peak.

In Example 6, the spectral sensitivity peak wavelength lies at 920 nm. Accordingly, even when a near-infrared light source having a peak emission wavelength at about 880 nm at room temperature (near-infrared light source having spectral characteristics (the vertical axis on the right side) of radiated light indicated by the broken line of FIG. 12) is used and a peak shift of the emission wavelength to the long-wavelength side and a decrease in the radiant output are caused in the near-infrared light source by an increase in temperature, the sensitivity of the spectral sensitivity characteristics of the near-infrared photoelectric conversion element increases, that is, the external quantum efficiency increases with a shift from the peak emission wavelength of the near-infrared light source to the long-wavelength side. Consequently, in terms of the entire camera system, since the imaging device easily detects near-infrared light, matching between the near-infrared light source and the sensitivity of the near-infrared photoelectric conversion element of the imaging device improves, and good imaging can be performed.

In Example 7, the spectral sensitivity peak wavelength lies at 980 nm. Accordingly, even when a near-infrared light source having a peak emission wavelength at about 940 nm at room temperature (near-infrared light source having spectral characteristics (the vertical axis on the right side) of radiated light indicated by the broken line of FIG. 13) is used and a peak shift of the emission wavelength to the long-wavelength side and a decrease in the radiant output are caused in the near-infrared light source by an increase in temperature, the sensitivity of the spectral sensitivity characteristics of the near-infrared photoelectric conversion element increases, that is, the external quantum efficiency increases with a shift from the peak emission wavelength of the near-infrared light source to the long-wavelength side. Consequently, in terms of the entire camera system, since the imaging device easily detects near-infrared light, matching between the near-infrared light source and the sensitivity of the near-infrared photoelectric conversion element of the imaging device improves, and good imaging can be performed.

In Example 8, the spectral sensitivity peak wavelength lies at 1,000 nm. Accordingly, even when a near-infrared light source having a peak emission wavelength at about 980 nm at room temperature (near-infrared light source having spectral characteristics (the vertical axis on the right side) of radiated light indicated by the broken line of FIG. 14) is used and a peak shift of the emission wavelength to the long-wavelength side and a decrease in the radiant output are caused in the near-infrared light source by an increase in temperature, the sensitivity of the spectral sensitivity characteristics of the near-infrared photoelectric conversion element increases, that is, the external quantum efficiency increases with a shift from the peak emission wavelength of the near-infrared light source to the long-wavelength side. Consequently, in terms of the entire camera system, since the imaging device easily detects near-infrared light, matching between the near-infrared light source and the sensitivity of the near-infrared photoelectric conversion element of the imaging device improves, and good imaging can be performed.

A composition, a near-infrared photoelectric conversion element, and an imaging device according to the present disclosure have been described on the basis of embodiments and Examples. The present disclosure is not limited to the embodiments or the Examples. The scope of the present disclosure includes forms achieved by applying various modifications conceived by those skilled in the art to the embodiments or Examples and other forms achieved by combining some of components in the embodiments or Examples without departing from the object of the present disclosure.

The camera system according to the present disclosure is applicable to a vehicle-mounted camera, a monitoring camera, or the like and is suitable as, for example, a camera that captures images even during the night in which light due to sunlight is absent.

What is claimed is:

1. A camera system comprising:
a light source having a peak emission wavelength at room temperature in a near-infrared region; and
an imaging device including a photoelectric conversion film that converts near-infrared light into an electric charge, wherein
an external quantum efficiency of the photoelectric conversion film has a first peak at a first wavelength in a near-infrared region, and
the external quantum efficiency at the first wavelength is higher than the external quantum efficiency at the peak emission wavelength.

2. The camera system according to claim 1, wherein the photoelectric conversion film has spectral sensitivity in a wavelength range of greater than or equal to −30 nm and less than or equal to +30 nm with respect to the peak emission wavelength.

3. The camera system according to claim 1, wherein the peak emission wavelength is greater than or equal to 800 nm and less than or equal to 980 nm.

4. The camera system according to claim 1, wherein the light source is a light emitting diode that emits monochromatic light.

5. The camera system according to claim 1, wherein the photoelectric conversion film includes an organic material as a photoelectric conversion material.

6. The camera system according to claim 5, wherein the organic material is a phthalocyanine derivative or a naphthalocyanine derivative.

7. A camera system comprising:
a light source having a peak emission wavelength at room temperature in a near-infrared region; and
an imaging device including a photoelectric conversion element that converts near-infrared light into an electric charge, wherein
an external quantum efficiency of the photoelectric conversion element has a first peak at a first wavelength in a near-infrared region,
the external quantum efficiency at the first wavelength is higher than the external quantum efficiency at the peak emission wavelength,
the external quantum efficiency of the photoelectric conversion element further has a second peak at a second wavelength shorter than the peak emission wavelength, and
the external quantum efficiency at the second wavelength is higher than the external quantum efficiency at the peak emission wavelength.

8. The camera system according to claim 1, wherein the photoelectric conversion film has spectral sensitivity at the peak emission wavelength.

9. The camera system according to claim 1, wherein the imaging device includes
a substrate,
a charge detection circuit disposed on or in the substrate, and
a pixel that includes a photoelectric converter disposed on the substrate and including the photoelectric conversion film, and a charge storage node electrically connected to the charge detection circuit and the photoelectric converter.

10. The camera system according to claim 1, wherein the external quantum efficiency of the photoelectric conversion film is greater than or equal to 20% at the peak emission wavelength.

11. The camera system according to claim 1, wherein the external quantum efficiency at a wavelength 200 nm longer than the first wavelength is less than 1%.

12. The camera system according to claim 1, wherein the external quantum efficiency of the photoelectric conversion film further has a second peak at a second wavelength shorter than the peak emission wavelength.

13. The camera system according to claim 1, wherein the imaging device has no filter that transmits light with a particular wavelength.

14. The camera system according to claim 1, wherein the light source is configured to shift the peak emission wavelength by a temperature change.

15. The camera system according to claim 1, wherein the light source is configured to cause a change in a radiant intensity by a temperature change.

16. The camera system according to claim 7, wherein the photoelectric conversion element has spectral sensitivity in a wavelength range of greater than or equal to −30 nm and less than or equal to +30 nm with respect to the peak emission wavelength.

17. The camera system according to claim 7, wherein the peak emission wavelength is greater than or equal to 800 nm and less than or equal to 980 nm.

18. The camera system according to claim 7, wherein the light source is a light emitting diode that emits monochromatic light.

19. The camera system according to claim 7, wherein the photoelectric conversion element includes an organic material as a photoelectric conversion material.

20. The camera system according to claim 19, wherein the organic material is a phthalocyanine derivative or a naphthalocyanine derivative.

* * * * *